US011276640B2

(12) United States Patent
Uchida

(10) Patent No.: US 11,276,640 B2
(45) Date of Patent: *Mar. 15, 2022

(54) SEMICONDUCTOR DEVICE, ELECTRONIC CIRCUIT HAVING THE SAME, AND SEMICONDUCTOR DEVICE FORMING METHOD

(71) Applicant: Renesas Electronics Corporation, Tokyo (JP)

(72) Inventor: Shinichi Uchida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/577,228

(22) Filed: Sep. 20, 2019

(65) Prior Publication Data

US 2020/0013716 A1 Jan. 9, 2020

Related U.S. Application Data

(62) Division of application No. 15/858,529, filed on Dec. 29, 2017, now Pat. No. 10,446,485.

(30) Foreign Application Priority Data

Apr. 7, 2017 (JP) .................................. 2017-076933

(51) Int. Cl.
*H01L 23/522* (2006.01)
*H01L 49/02* (2006.01)
*H01L 23/58* (2006.01)

(52) U.S. Cl.
CPC ...... *H01L 23/5227* (2013.01); *H01L 23/5225* (2013.01); *H01L 23/5226* (2013.01); *H01L 23/585* (2013.01); *H01L 28/10* (2013.01)

(58) Field of Classification Search
CPC ............ H01L 23/5227; H01L 23/5225; H01L 23/585; H01L 28/10; H01L 23/5226
See application file for complete search history.

(56) References Cited

U.S. PATENT DOCUMENTS 8,686,539 B1 * 4/2014 Kireev ................ H01L 23/5225
257/531
8,686,639 B2 4/2014 Komurasaki et al.
(Continued)

FOREIGN PATENT DOCUMENTS

| JP | 2006-179596 A | 7/2006 |
| JP | 2011-199225 A | 10/2011 |
| JP | 2017059639 A * | 3/2017 |

OTHER PUBLICATIONS

Japanese Office Action dated Aug. 25, 2020, in Japanese Patent Application No. 2017-076933 with an English translation.
(Continued)

*Primary Examiner* — Bitew A Dinke
(74) *Attorney, Agent, or Firm* — McGinn IP Law Group, PLLC

(57) ABSTRACT

A semiconductor device includes a plurality of first wires formed in a first layer, a plurality of second wires formed to intersect the plurality of first wires in a second layer stacked on the first layer, a plurality of first vias formed at intersections of the plurality of first wires and the plurality of second wires, and an inductor formed in a third layer stacked on the first layer and the second layer.

20 Claims, 19 Drawing Sheets

(56) References Cited

U.S. PATENT DOCUMENTS

| | | | |
|---|---|---|---|
| 10,446,485 B2* | 10/2019 | Uchida | H01L 23/5227 |
| 2003/0141501 A1 | 7/2003 | Komurasaki | |
| 2004/0104724 A1* | 6/2004 | Sato | G01R 33/0064 |
| | | | 324/224 |
| 2005/0156700 A1* | 7/2005 | Chang | H01F 17/0006 |
| | | | 336/200 |
| 2005/0258507 A1* | 11/2005 | Tseng | H01L 21/8221 |
| | | | 257/531 |
| 2006/0049481 A1* | 3/2006 | Tiemeijer | H01L 23/5227 |
| | | | 257/531 |
| 2006/0157798 A1* | 7/2006 | Hayashi | H01L 23/5227 |
| | | | 257/374 |
| 2007/0052062 A1* | 3/2007 | Ding | H01L 23/5225 |
| | | | 257/528 |
| 2007/0164430 A1 | 7/2007 | Lin | |
| 2008/0042236 A1 | 2/2008 | Seah | |
| 2008/0290454 A1* | 11/2008 | Fujii | H01L 23/5223 |
| | | | 257/529 |
| 2009/0096061 A1* | 4/2009 | Uchida | H01L 23/585 |
| | | | 257/531 |
| 2009/0146252 A1* | 6/2009 | Huang | H01L 28/10 |
| | | | 257/531 |
| 2009/0152674 A1* | 6/2009 | Uchida | H01L 29/0619 |
| | | | 257/531 |
| 2010/0193904 A1 | 8/2010 | Watt | |
| 2011/0080247 A1* | 4/2011 | Horiuchi | H01F 17/0013 |
| | | | 336/221 |
| 2011/0235302 A1* | 9/2011 | Hijioka | H01L 23/5227 |
| | | | 361/811 |
| 2013/0234285 A1* | 9/2013 | Hijioka | H01L 28/10 |
| | | | 257/531 |
| 2013/0234286 A1* | 9/2013 | Nakashiba | H01L 23/66 |
| | | | 257/531 |
| 2014/0078709 A1* | 3/2014 | Hashimoto | H01L 23/585 |
| | | | 361/818 |
| 2014/0284763 A1* | 9/2014 | Yeh | H01L 23/481 |
| | | | 257/531 |
| 2015/0061660 A1* | 3/2015 | Nemoto | G01R 21/00 |
| | | | 324/244 |
| 2016/0148926 A1 | 5/2016 | Lee et al. | |
| 2017/0018349 A1* | 1/2017 | Otsubo | H01F 17/0033 |
| 2017/0062113 A1* | 3/2017 | Otsubo | H01F 27/292 |
| 2017/0062332 A1* | 3/2017 | Kuwajima | H01L 23/5227 |
| 2017/0359097 A1* | 12/2017 | Uchida | H01L 28/10 |
| 2018/0047667 A1 | 2/2018 | Uchida | |
| 2018/0076134 A1* | 3/2018 | Jing | H01L 23/5225 |

OTHER PUBLICATIONS

United States Notice of Allowance dated Jun. 3, 2019, in U.S. Appl. No. 15/858,529.
United States Office Action dated Jan. 17, 2019, in U.S. Appl. No. 15/858,529.

* cited by examiner

SEMICONDUCTOR DEVICE, ELECTRONIC CIRCUIT HAVING THE SAME, AND SEMICONDUCTOR DEVICE FORMING METHOD

CROSS-REFERENCE TO RELATED APPLICATIONS

The present application is a Divisional Application of U.S. patent application Ser. No. 15/858,529, filed on Dec. 29, 2017, which is based on Japanese Patent Application No. 2017-076933, filed on Apr. 7, 2017, the disclosure of which is incorporated herein in its entirety by reference.

BACKGROUND

The present invention relates to a semiconductor device, an electronic circuit including the semiconductor device, and a semiconductor device forming method. More particularly, the present invention relates to, for example, a semiconductor device which is suitable for suppressing characteristics deterioration of an inductor without increasing a circuit scale, an electronic circuit including the semiconductor device, and a semiconductor device forming method.

As the speed of digital circuits has become higher, there has been a demand that an amplifier circuit which amplifies a digital signal performs matching by using an inductor as a load, and thereby increase a gain for a high frequency input signal.

When the inductor is formed together with an electronic circuit on a semiconductor substrate, magnetic fluxes produced by the inductor produce counter-electromotive currents on wires to which fixed potentials such as power supply voltages and ground voltages propagate. There is a problem that the inductor is influenced by the magnetic fluxes produced by the counter-electromotive currents and thus it cannot normally operate.

A solution of this problem is disclosed in Japanese Unexamined Patent Application Publication No. 2011-199225. A semiconductor device disclosed in Japanese Unexamined Patent Application Publication No. 2011-199225 includes a shielding conductor (shield) between an inductor element and wires to prevent the magnetic fluxes produced by the counter-electromotive currents on the wires from deteriorating characteristics of the inductor.

SUMMARY

However, a configuration according to Japanese Unexamined Patent Application Publication No. 2011-199225 needs to additionally include the shield, and therefore has a problem that a circuit scale increases. The other problems of the related art and the novel characteristics of the present invention will be made apparent from the descriptions of the specification and the accompanying drawings.

According to one embodiment, a semiconductor device includes: a plurality of first wires formed in a first layer and configured to indicate a fixed potential; and an inductor formed in a second layer stacked on the first layer, and a wiring width of the first wiring located within a range of a formation region of the inductor in a plan view among the plurality of first wires is formed narrower than a wiring width of the first wiring located outside the range of the formation region of the inductor.

According to another embodiment, a semiconductor device includes: a plurality of first wires formed in a first layer; a plurality of second wires formed to intersect the plurality of first wires in a second layer stacked on the first layer; a plurality of first vias formed at intersections of the plurality of first wires and the plurality of second wires; and an inductor formed in a third layer stacked on the first layer and the second layer, and the plurality of first vias are disposed such that a length of a loop having a minimum length among a plurality of current path loops formed by the plurality of first wires, the plurality of second wires and the plurality of first vias in a plan view is longer than a predetermined length.

According to still another embodiment, a method for forming a semiconductor device includes: forming in a first layer a plurality of first wires configured to indicate a fixed potential; and forming an inductor in a second layer stacked on the first layer, and in the forming the plurality of first wires, a wiring width of the first wire located within a range of a formation region of the inductor in the plan view among the plurality of first wires is narrowed compared to a wiring width of the first wire located outside the range of the formation region of the inductor.

The one embodiment can provide a semiconductor device which can suppress characteristics deterioration of an inductor without increasing a circuit scale, an electronic circuit including the semiconductor device, and a semiconductor device forming method.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
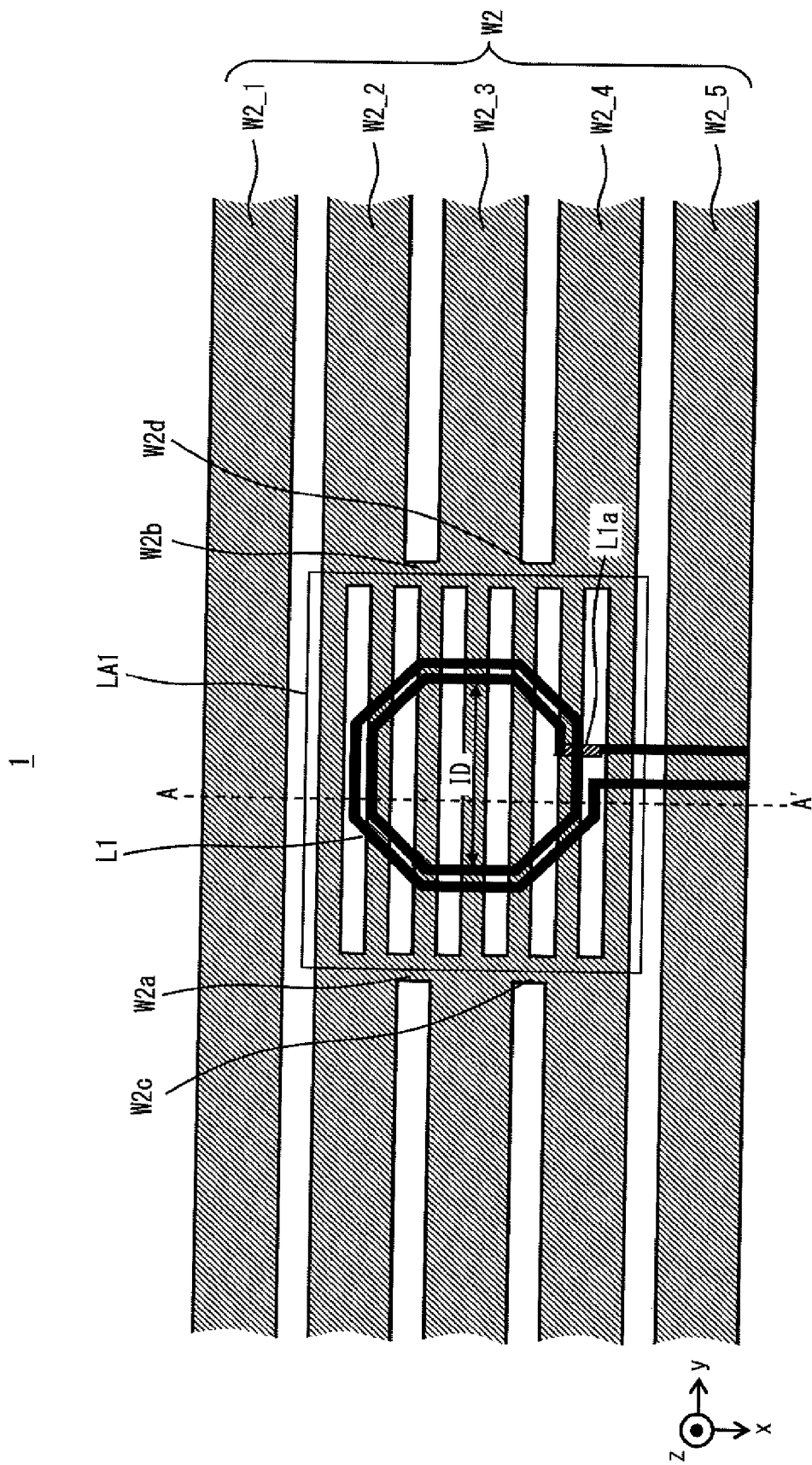
FIG. 1 is a schematic plan view illustrating a layout configuration example of a semiconductor device according to a first embodiment.

Embodiments will be described below with reference to the drawings. In this regard, the drawings are simple ones, yet a technical scope of the embodiments should not be narrowly interpreted on the ground of the illustration of these drawings. Further, the same components will be assigned the same reference numerals, and overlapping description thereof will be omitted.

The following embodiments will be divided into a plurality of sections or embodiments when necessary for ease of description and described, yet are not irrelevant to each other unless specified in particular. One embodiment has a relationship of a modified example, an application example, detailed description or supplementary description with part or all of the other embodiments. Further, in the following embodiments, mentioned numbers (numbers, numerical values, quantities and ranges) of components are not limited to specific numbers unless the mentioned numbers are particularly specified or are fundamentally obviously limited to specific numbers, and may be the specific numbers or more.

Furthermore, in the following embodiments, the components (including operation steps too) are not necessarily indispensable unless the components are particularly specified or are fundamentally obviously indispensable. Similarly, in the following embodiments, mentioned shapes and positional relationships of the components include substantially approximate or similar shapes unless the mentioned shapes and positional relationships are particularly specified and are not fundamentally obviously true. This applies to the above numbers (including the numbers, the numerical values, the quantities and the ranges), too.

First Embodiment

A semiconductor device 1 according to the first embodiment will be described below.

(Layout Configuration of Semiconductor Device 1)

FIG. 1 is a schematic plan view illustrating a layout configuration example of the semiconductor device 1 according to the first embodiment. For ease of description, the example in FIG. 1 illustrates only a structure of a second metal layer M2, a third metal layer M3 and a fourth metal layer M4.

As illustrated in FIG. 1, the second metal layer M2 is formed such that a plurality of wires W2 extend in one direction (a y axis direction in this embodiment). A plurality of these wires W2 are formed, for example, in slit shapes over the entire second metal layer M2. FIG. 1 illustrates wires W2_1 to W2_5 as part of a plurality of wires W2. In addition, fixed potentials propagate to a plurality of wires W2. An example of the present embodiment where a power supply voltage VDD propagates to a plurality of wires W2 will now be described.

An inductor L1 is formed in the third metal layer M3 and the fourth metal layer M4 stacked on the second metal layer M2. The inductor L1 is mainly formed in a helical shape in the fourth metal layer M4, and only an intersection portion L1a is formed in the third metal layer M3.

(Schematic Cross-Sectional View of Semiconductor Device 1)

Figure 2:
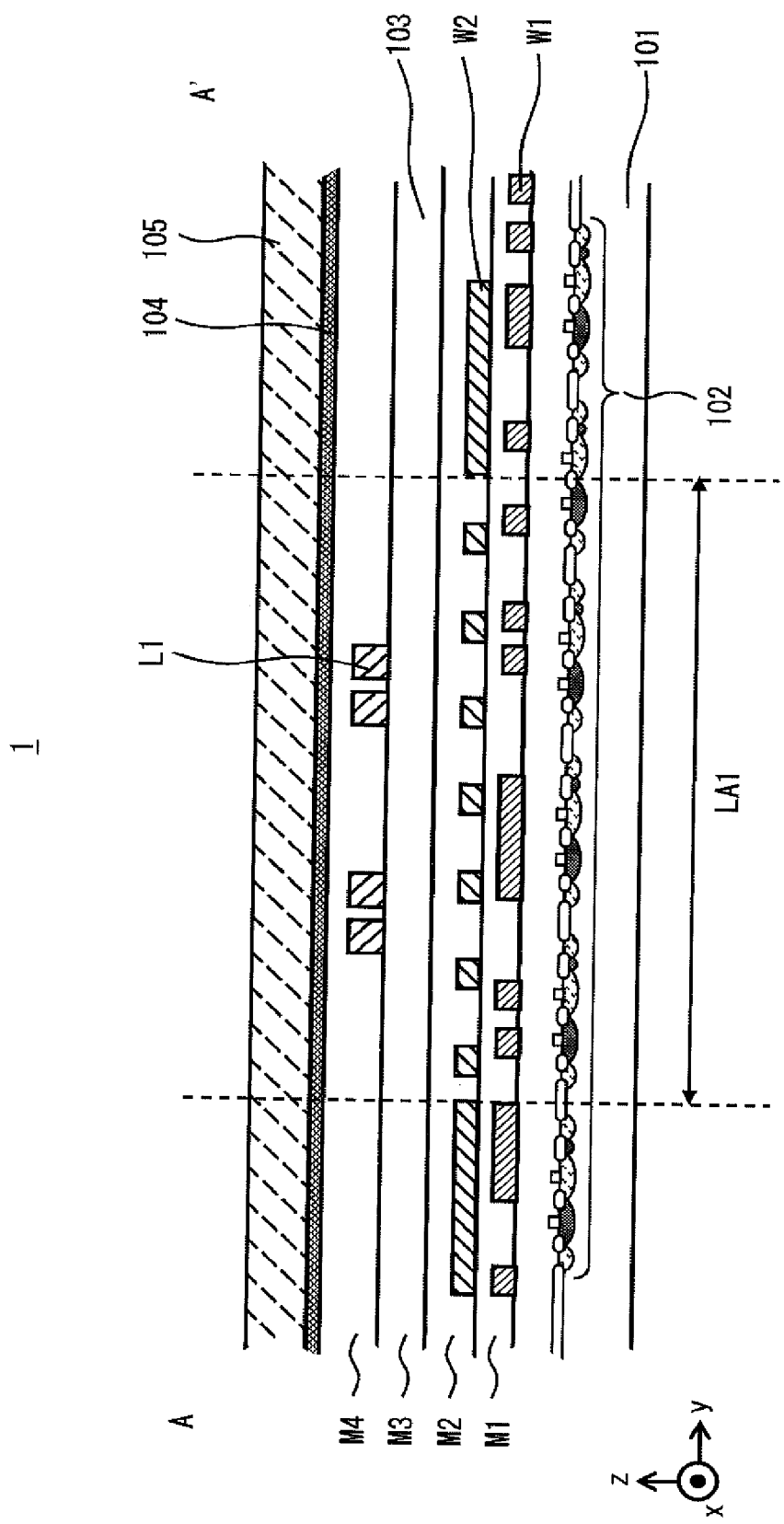
FIG. 2 is a schematic cross-sectional view of the semiconductor device illustrated in FIG. 1.

FIG. 2 is a schematic cross-sectional view of the semiconductor device 1. The schematic cross-sectional view of FIG. 2 illustrates an A-A' cross section in FIG. 1.

As illustrated in FIG. 2, in the semiconductor device 1, P wells and N wells are formed on a surface of a silicon substrate 101, and a diffusion layer, a gate oxide film and a polysilicon are formed thereon to form a plurality of MOS transistors which compose an internal circuit 102. In this regard, a plurality of MOS transistors include, for example, MOS transistors Tr1 and Tr2 used for an amplifier circuit 11 described below.

Above the layer in which the internal circuit 102 is formed, a first metal layer M1, the second metal layer M2, the third metal layer M3 and the fourth metal layer M4 are stacked in order with a silicon oxide film 103 interposed between the metal layers.

In the first metal layer M1, a plurality of wires W1 which connect a plurality of MOS transistors are arranged. In the second metal layer M2, a plurality of wires W2 to which the power supply voltage VDD which is a fixed potential propagates are arranged.

In the third metal layer M3 and the fourth metal layer M4, the inductor L1 is formed. The inductor L1 is mainly formed in a helical shape in the fourth metal layer M4, and only the intersection portion L1a is formed in the third metal layer M3.

A silicon nitride film 104 is formed on a surface of the fourth metal layer M4, and a polyimide 105 is further formed thereon.

Referring again to FIG. 1, the description is continued.

In addition, an inductor formation region LA1 is defined for the inductor L1. The inductor formation region LA1 includes at least a region surrounded by an outer circumferential side of the inductor L1 in a plan view.

Further, when a guard ring is arranged in the same layer as an inductor L1 formation layer, the inductor formation region LA1 is a region surrounded by the guard ring in the plan view.

Figure 3:
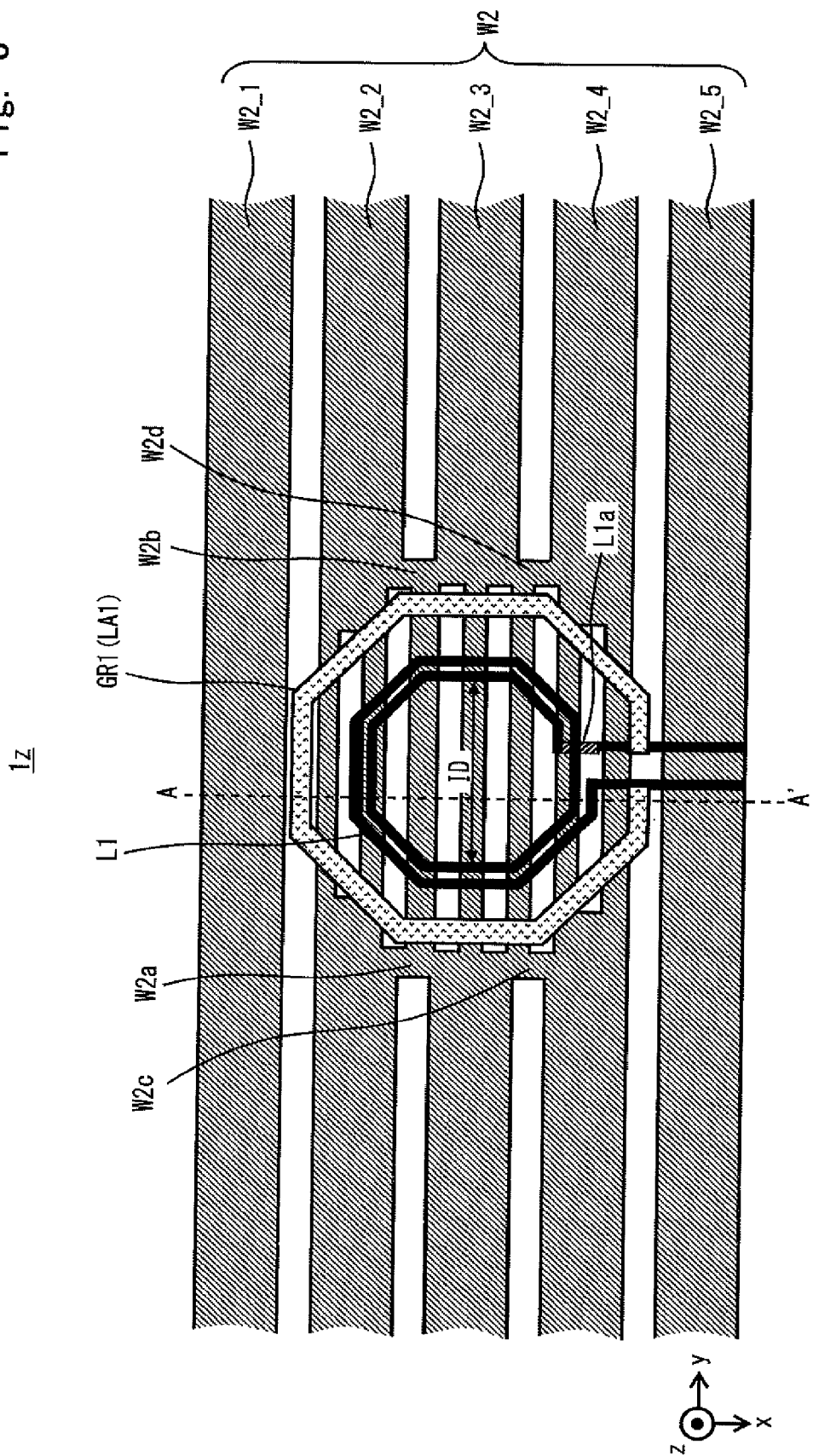
FIG. 3 is a schematic plan view illustrating a layout configuration example of the semiconductor device in a case where a guard ring is arranged.
Figure 4:
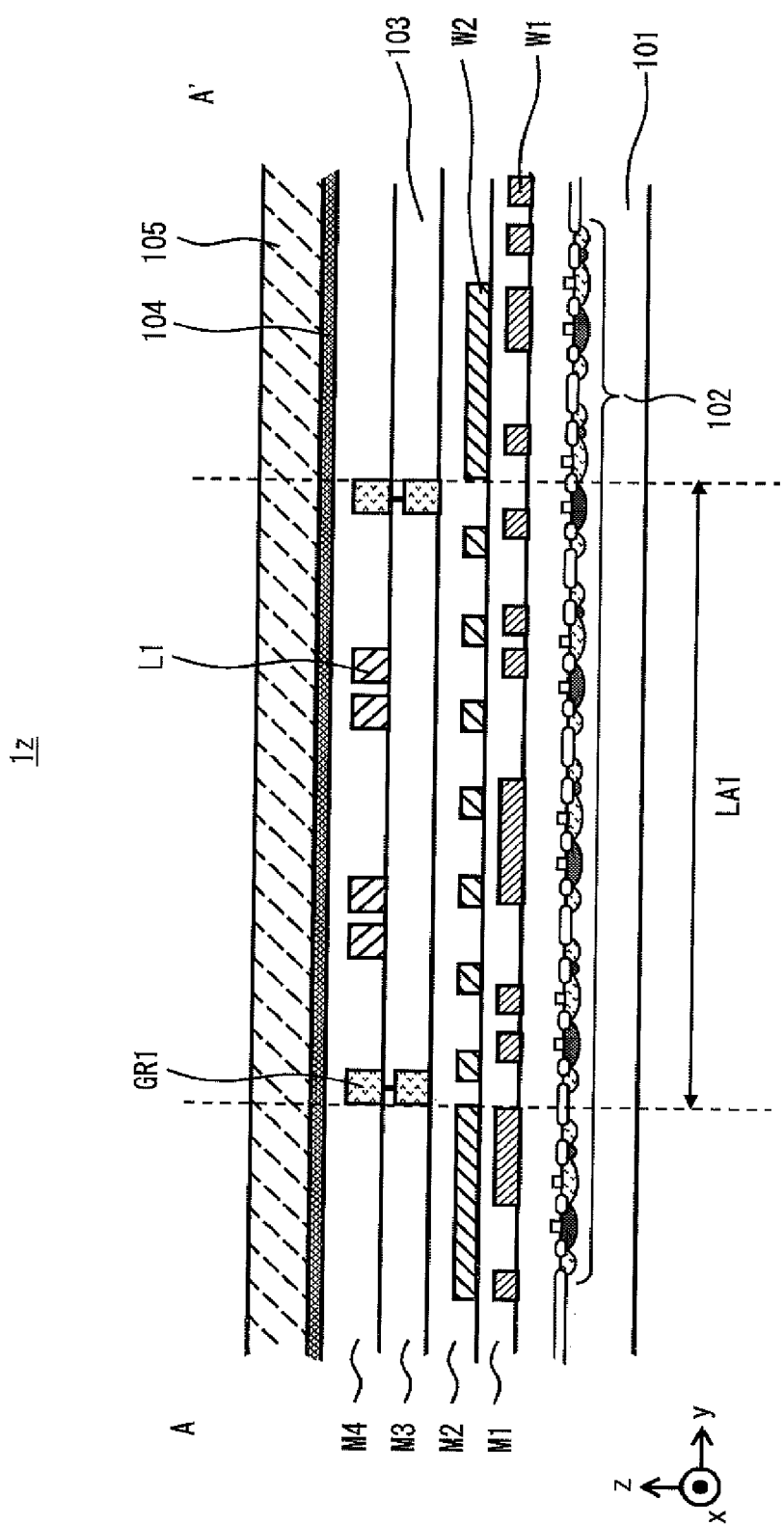
FIG. 4 is a schematic cross-sectional view of the semiconductor device illustrated in FIG. 3.

FIG. 3 is a schematic plan view illustrating a layout configuration example of the semiconductor device 1 provided with the guard ring as a semiconductor device 1z. FIG. 4 is a schematic cross-sectional view of the semiconductor device 1z provided with the guard ring. A guard ring GR1 has a function of preventing leakage of magnetic fluxes produced from the inductor L1 to an outside of the region surrounded by the guard ring GR1. More specifically, as illustrated in FIG. 3, the guard ring GR1 is formed to surround an outer circumference of the inductor L1 in the plan view. Further, as illustrated in FIG. 4, the guard ring GR1 is formed in the third metal layer M3 and the fourth metal layer M4 which compose the inductor L1 formation layer. In this regard, the guard ring GR1 may be formed in only one of the third metal layer M3 and the fourth metal layer M4.

Further, the inductor formation region LA1 is preferably determined based on an inner diameter ID of the inductor L1 in the plan view. When, for example, the inner diameter ID is reduced while keeping the outer diameter thereof constant, the magnetic fluxes produced by the inductor L1 become great, and therefore the inductor formation region LA1 is made increased. By contrast with this, when the inner diameter ID is increased while keeping the outer diameter thereof constant, the magnetic fluxes produced by the inductor L1 become small, and therefore the inductor formation region LA1 is made decreased.

In addition, wiring widths (lengths in an x axis direction) of the wires W2 formed in a fixed potential wiring layer (second metal layer M2) located within the range of the inductor formation region LA1 in the plan view among a plurality of wires W2 are formed narrower than the wiring widths of the wires W2 formed in the fixed potential wiring layer located outside the range of the inductor formation region LA1. In this example, the wiring widths of wires located within the range of the inductor formation region LA1 among the wire W2_2, wire W2_3 and wire W2_4 are formed narrower than the wiring widths of the wires located outside the range of the inductor formation region LA1.

Consequently, it is possible to prevent an influence of the magnetic fluxes from the inductor L1 from producing counter-electromotive currents on the wires W2. Further, by preventing the producing of the counter-electromotive currents, it is possible to prevent deterioration of characteristics of the inductor L1 caused by the influence of the magnetic fluxes produced by the counter-electromotive currents.

In this regard, a percentage per unit area that the wires W2 occupy inside the inductor formation region LA1 in the plan view is preferably the same as that occupied outside this region. Consequently, it is possible to make resistivities of the wires W2 located inside the inductor formation region LA1 the same as those located outside this region. In the present embodiment, the three wires W2_2, W2_3 and W2_4 arranged outside the inductor formation region LA1 in the plan view are branched into seven wires in total in the inductor formation region LA1.

Furthermore, a plurality of wires W2 are formed to short-circuit each other in the fixed potential wiring layer (second metal layer M2) located at a boundary line between the inductor formation region LA1 and a non-formation region in the plan view. In the present embodiment, in the fixed potential wiring layer located at the boundary line between the inductor formation region LA1 and the non-formation region in the plan view, wires W2a and W2b short-circuit between the wires W2_2 and W2_3, and wires W2c and W2d short-circuit between the wires W2_3 and W2_4. Consequently, it is possible to adjust potentials of a plurality of wires W2 to the same potential near the boundary line.

(Effect of Semiconductor Device 1)

Figure 5:
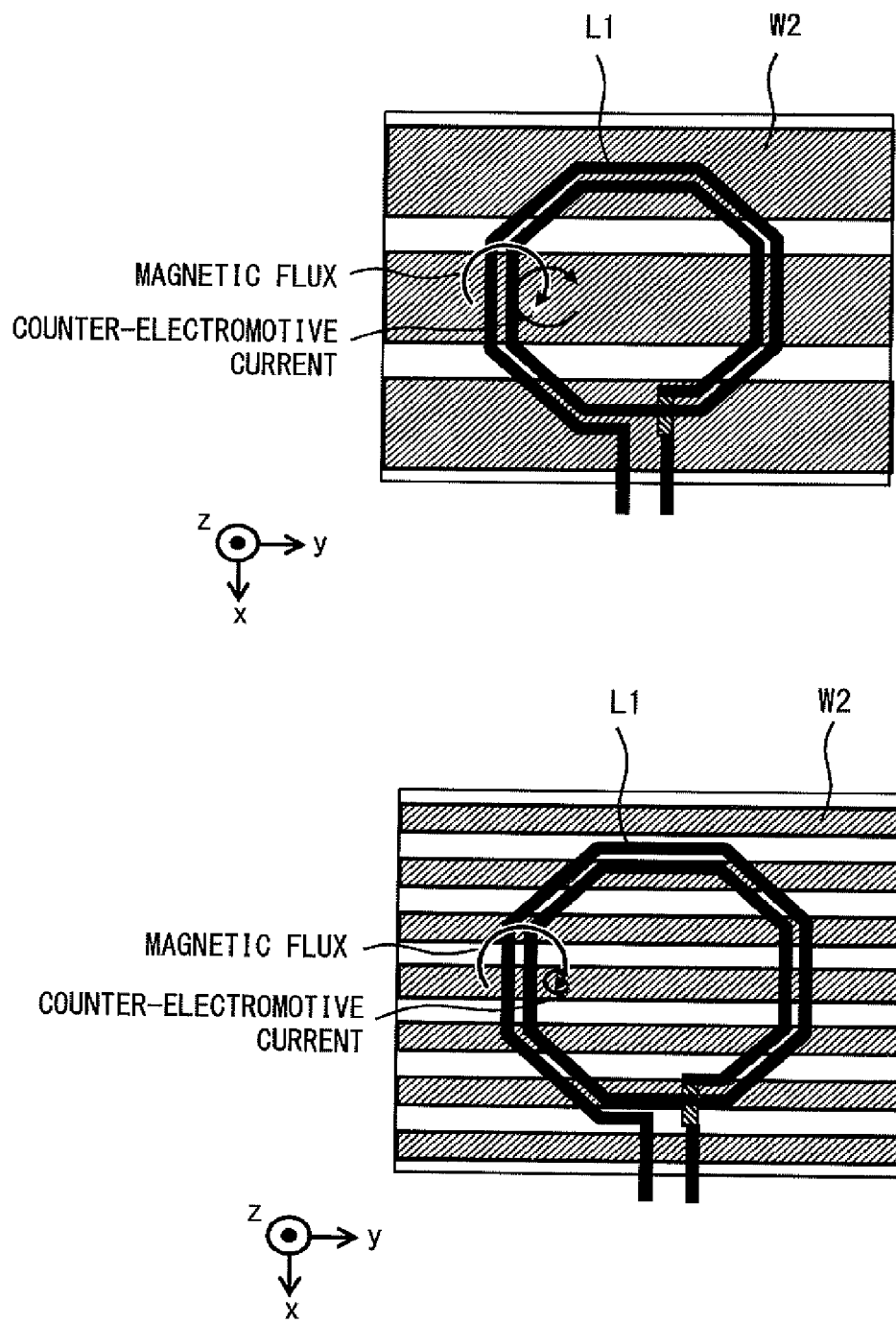
FIG. 5 is a view for explaining an effect of the semiconductor device according to the first embodiment.

FIG. 5 is a view for explaining an effect of the semiconductor device 1. In addition, FIG. 5 illustrates a layout configuration (left view) where a plurality of wires W2 located in the inductor formation region LA1 in the plan view are not narrowed, and a layout configuration (right view) where a plurality of wires W2 located in the inductor formation region LA1 in the plan view are narrowed.

First, the case where the wires W2 located in the inductor formation region LA1 in the plan view are not narrowed will be described. In this case, the magnetic fluxes produced by the inductor L1 produce counter-electromotive currents in the wires W2 to which the fixed potentials propagate. Eddy currents formed on the wires W2 by the counter-electromotive currents are formed so as to flow in a direction to cancel the magnetic fluxes of the inductor L1. In this regard, the eddy currents have current paths of large inner diameters corresponding to the wide wiring widths of the wires W2, and therefore produce great magnetic fluxes. The inductor L1 is influenced by the magnetic fluxes produced by the counter-electromotive currents, and cannot normally operate (in other words, characteristics of the inductor L1 are deteriorated).

Next, the case where the wires W2 located in the inductor formation region LA1 in the plan view are narrowed will be described. In this case, the magnetic fluxes produced from the inductor L1 produce counter-electromotive currents in the wires W2 to which the fixed potentials propagate. Eddy currents formed on the wires W2 by the counter-electromotive currents are formed so as to flow in a direction to cancel the magnetic fluxes of the inductor L1. In this regard, the eddy currents have current paths of small inner diameters corresponding to the wiring widths of the wires W2, and therefore produce small magnetic fluxes compared to the case where the wires W2 are not narrowed. The inductor L1 is hardly influenced by the magnetic fluxes produced by the counter-electromotive currents, and consequently can normally operate (in other words, it is possible to prevent characteristics deterioration).

This shows that narrowing the wires W2 located in the inductor formation region LA1 in the plan view compared to the wires W2 located outside the inductor formation region LA1 makes it possible to prevent the characteristic deterioration of the inductor L1 without increasing a circuit scale.

Thus, by narrowing a plurality of wires W2 located in the inductor formation region LA1 in the plan view compared to the wires W2 located outside the inductor formation region LA1, the semiconductor device 1 according to the present embodiment can prevent the characteristics deterioration of the inductor L1. In addition, in this case, it is not necessary to arrange a shield between the inductor L1 and the wires W2, so that it is possible to prevent an increase in the circuit scale.

The present embodiment has described as an example a case where the power supply voltage VDD propagates to a plurality of wires W2, yet is not limited to this. For example, a ground voltage GND may propagate as a fixed potential to a plurality of wires W2. Alternatively, a predetermined signal indicating a fixed potential may propagate to a plurality of wires W2.

Further, the present embodiment has described as an example a case where only a plurality of wires W2 are arranged in the second metal layer M2, yet is not limited to this. In, for example, the second metal layer M2, a plurality of wires W3 to which the ground voltage GND propagates may be further arranged in addition to a plurality of wires W2 to which the power supply voltage VDD propagates. In this case, a plurality of wires W3 located in the range of the inductor formation region LA1 in the plan view are narrowed compared to a plurality of wires W3 located outside the range of the inductor formation region LA1.

Further, the present embodiment has described as an example the case where a plurality of wires W2 to which the fixed potential propagates are arranged only in the second metal layer M2, yet is not limited to this. For example, a plurality of wires W4 to which a fixed potential propagates may be further arranged in an additionally formed metal layer (not illustrated). In this case, a plurality of wires W4 located in the range of the inductor formation region LA1 in the plan view are narrowed compared to a plurality of wires W4 located outside the range of the inductor formation region LA1.

Further, the present embodiment has described as an example the case where the inductor L1 and the fixed potential wires W2 are formed on the same semiconductor chip, yet is not limited to this. There may be, for example, a flip chip configuration where the inductor L1 and the fixed potential wires W2 are formed on different semiconductor chips, and these semiconductor chips are disposed facing each other.

Figure 6:
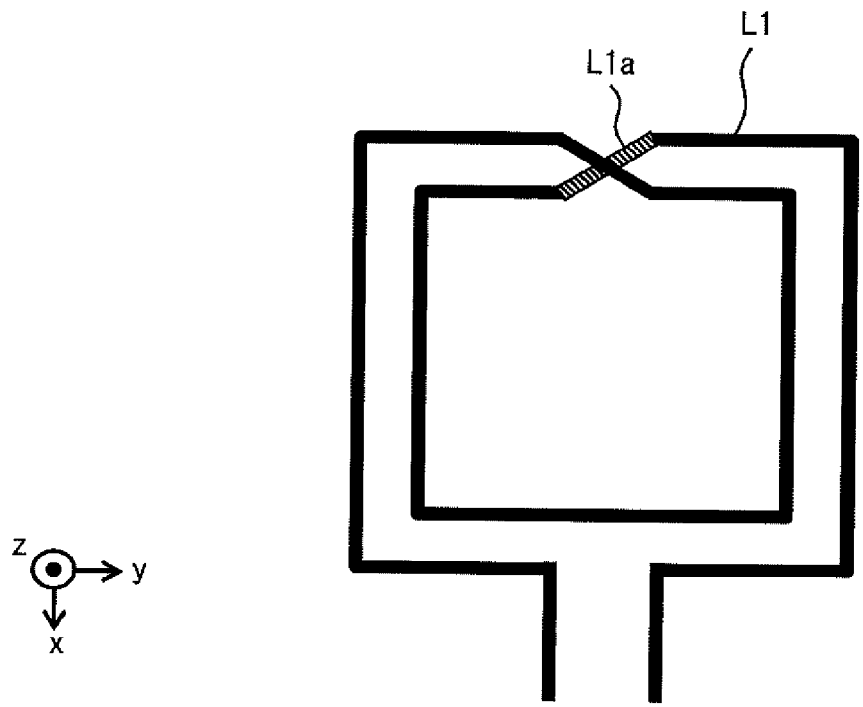
FIG. 6 is a schematic plan view illustrating another shape of an inductor.
Figure 7:
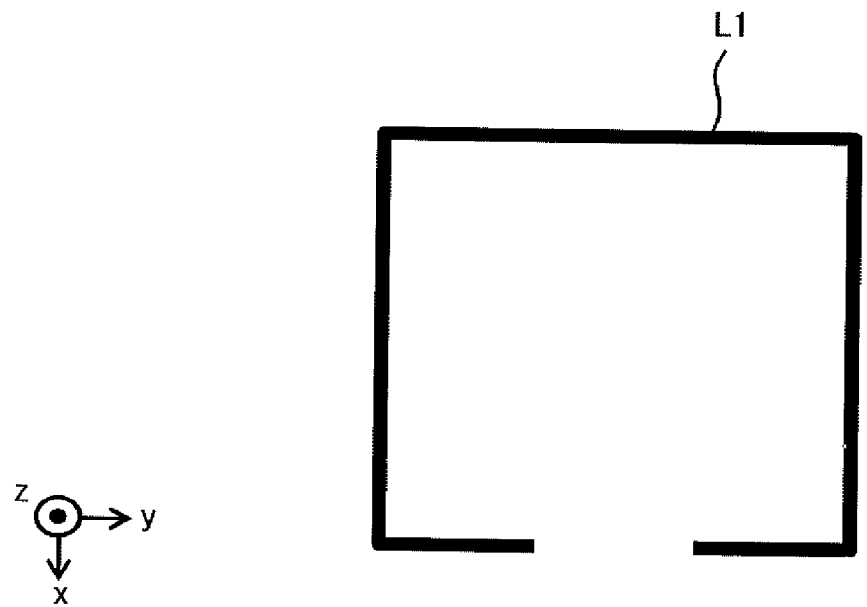
FIG. 7 is a schematic plan view illustrating still another shape of the inductor.
Figure 8:
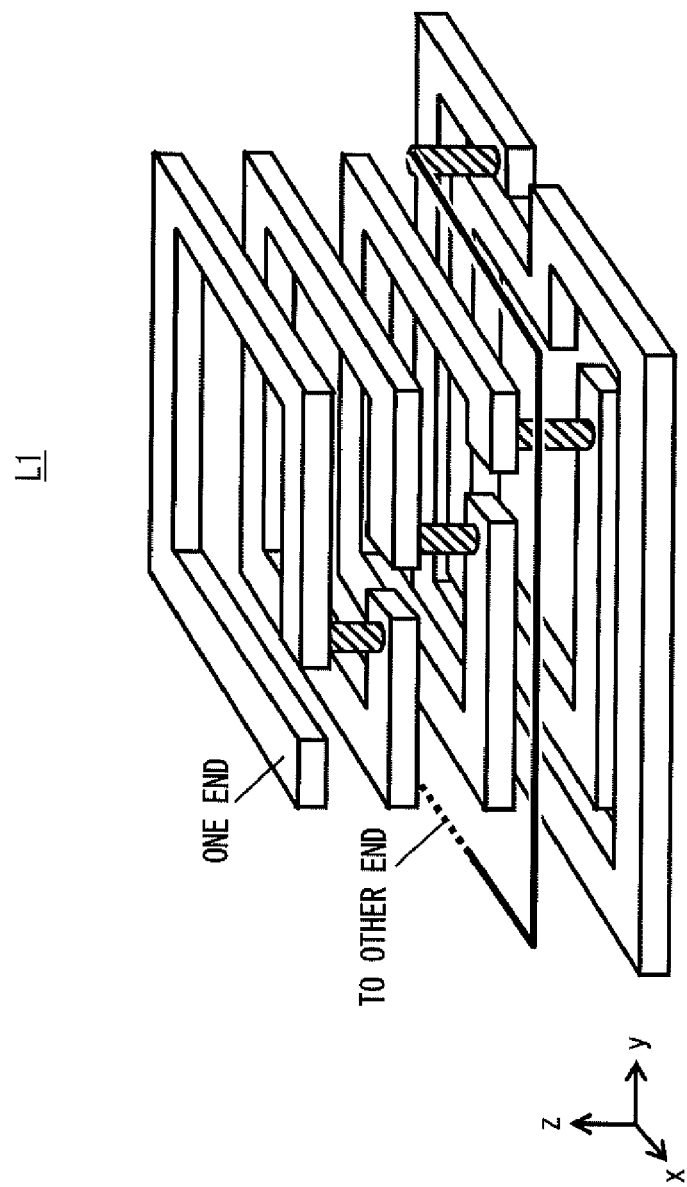
FIG. 8 is a schematic plan view illustrating yet still another shape of the inductor.

Further, the present embodiment has described as an example the case where the inductor L1 is formed in the helical shape in the plan view, yet is not limited to this. The inductor L1 may have a symmetrical type as illustrated in FIG. 6 or may be horseshoe types illustrated in FIGS. 7 and 8.

(Structure Application Example of Semiconductor Device 1)

Figure 9:
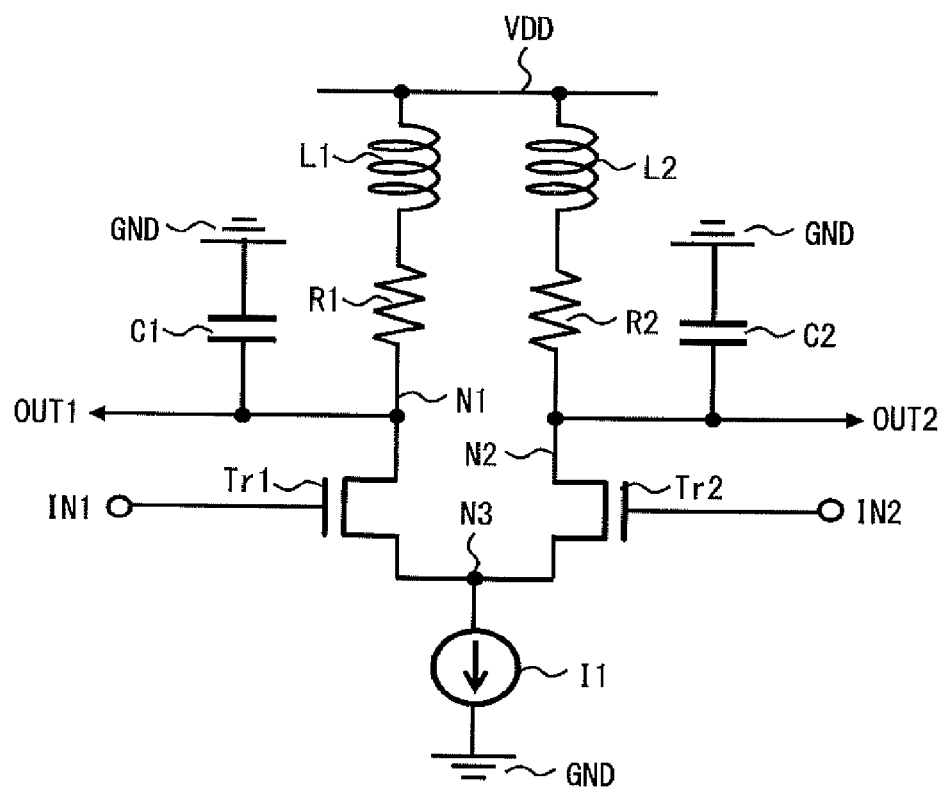
FIG. 9 is a circuit diagram illustrating a configuration example of an amplifier circuit to which an inductor structure of the semiconductor device illustrated in FIG. 1 is applied.

FIG. 9 is a circuit diagram illustrating a configuration example of the amplifier circuit 11 to which an inductor structure of the semiconductor device 1 is applied.

As illustrated in FIG. 9, the amplifier circuit 11 is a differential amplifier circuit which amplifies differential input signals IN1 and IN2, and outputs differential output signals OUT1 and OUT2, and includes the N-channel MOS transistors Tr1 and Tr2, resistor elements R1 and R2, capacitive elements C1 and C2, a constant current source I1 and inductors L1 and L2.

The MOS transistor Tr1 is disposed between a node N1 connected with the output terminal OUT1, and a node N3, and is turned on and off based on the other differential input signal IN2. The resistor element R1 and the inductor L1 are disposed in series between the node 1 and a power supply voltage terminal VDD. The capacitive element C1 is disposed between the node N1 and a ground voltage terminal GND.

The MOS transistor Tr2 is disposed between a node N2 connected with the output terminal OUT2, and the node N3, and is turned on and off based on the one differential input signal IN1. The resistor element R2 and the inductor L2 are disposed in series between the node N2 and the power supply voltage terminal VDD. The capacitive element C2 is disposed between the node N2 and the ground voltage terminal GND.

The constant current source I1 is disposed between the node N3 and the ground voltage terminal GND.

When the one differential input signal IN1 is larger than the other differential input signal IN2 in the amplifier circuit 11, a current flowing in the transistor Tr1 becomes larger than a current flowing in the transistor Tr2. Therefore, the one differential output signal OUT1 becomes larger than the other differential output signal OUT2. By contrast with this, when the one differential input signal IN1 is smaller than the other differential input signal IN2, the current flowing in the transistor Tr2 is smaller than the current flowing in the transistor Tr2. Therefore, the one differential output signal OUT1 is smaller than the other differential output signal OUT2.

Figure 15:
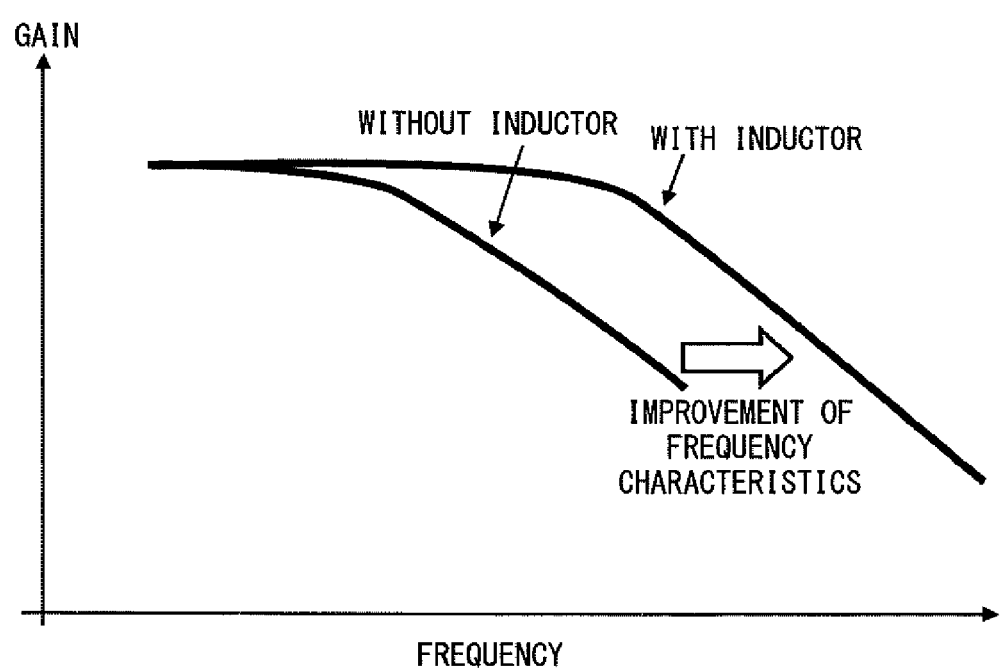
FIG. 15 is a view illustrating a relationship between frequency characteristics and a gain of the amplifier circuit before and after application of the inductors.

FIG. 15 is a view illustrating a relationship between frequency characteristics and a gain of the amplifier circuit 11 before and after application of the inductors L1 and L2. In this regard, in FIG. 15, a horizontal axis indicates frequency characteristics of the differential input signals IN1 and IN2, and a vertical axis indicates a gain of the amplifier circuit 11.

FIG. 15 illustrates improved characteristics of the amplifier circuit 11 to which the inductors L1 and L2 are applied compared to the amplifier circuit before application of the inductors L1 and L2. Consequently, the amplifier circuit 11 to which the inductors L1 and L2 are applied can amplify a high frequency differential input signal with a high gain.

Other Application Examples

Figure 10:
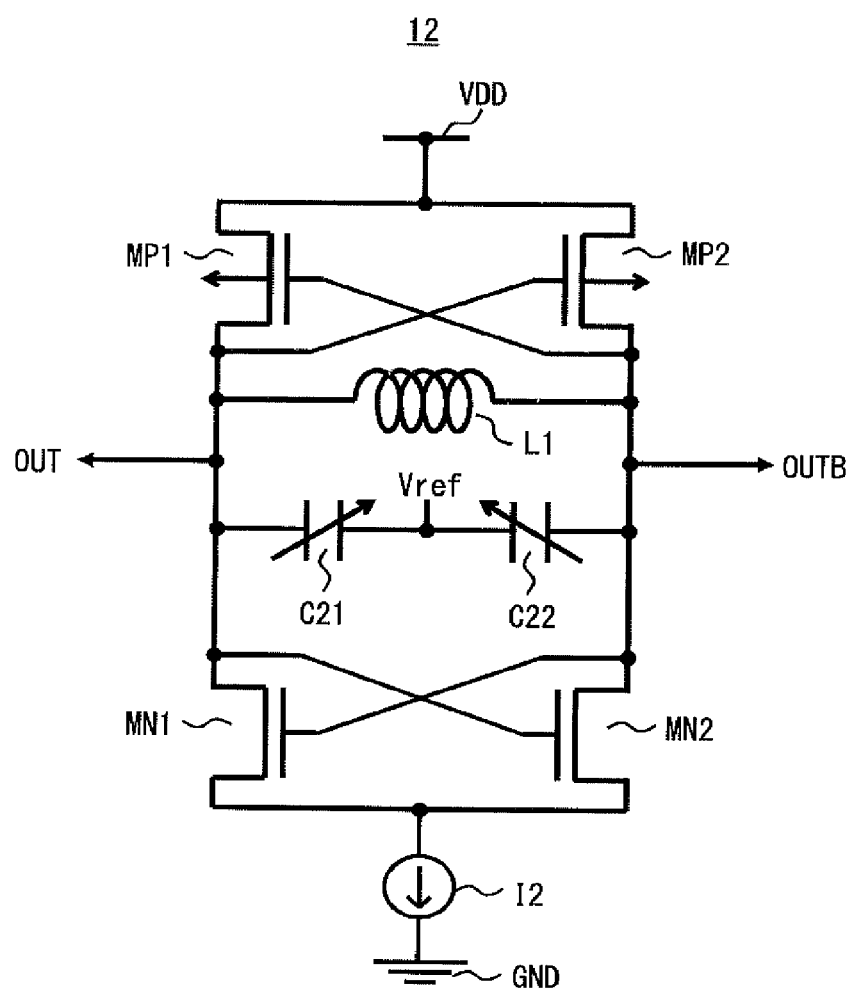
FIG. 10 is a circuit diagram illustrating a configuration example of an oscillator which includes an LC tank to which the inductor structure of the semiconductor device illustrated in FIG. 1 is applied.

FIG. 10 is a circuit diagram illustrating a configuration example of an oscillator 12 including an LC tank to which the inductor structure of the semiconductor device 1 is applied. The oscillator 12 includes transistors MP1, MP2, MN1 and MN2, variable capacitances C21 and C21, the inductor L1 and a constant current source 12.

The transistor MP1 includes a source connected with the power supply voltage terminal VDD, a drain connected with an output terminal OUT, and a gate connected with an output terminal OUTB. The transistor MN1 includes a source connected with the ground voltage terminal GND via the constant current source 12, a drain connected with the output terminal OUT, and a gate connected with the output terminal OUTB.

The transistor MP2 includes a source connected with the power supply voltage terminal VDD, a drain connected with the output terminal OUTB, and a gate connected with the output terminal OUT. The transistor MN2 includes a source connected with the ground voltage terminal GND via the constant current source 12, a drain connected with the output terminal OUTB, and a gate connected with the output terminal OUT.

That is a first inverter composed by the transistors MP1 and MN1, and a second inverter composed by transistors MP2 and MN2 are connected in a loop.

The inductor L1 is disposed between the output terminals OUT and OUTB. The variable capacitance C21 is disposed between the output terminal OUT, and a common terminal to which a reference voltage Vref is supplied. The variable capacitance C22 is disposed between the output terminal OUTB, and the common terminal to which the reference voltage Vref is supplied.

The oscillator 12 outputs an oscillation signal (and an inversion signal of the oscillation signal) of a resonance frequency determined based on inductivity of the inductor L1 and capacitivity of a varicap diode from the output terminal OUT (and the output terminal OUTB).

Figure 11:
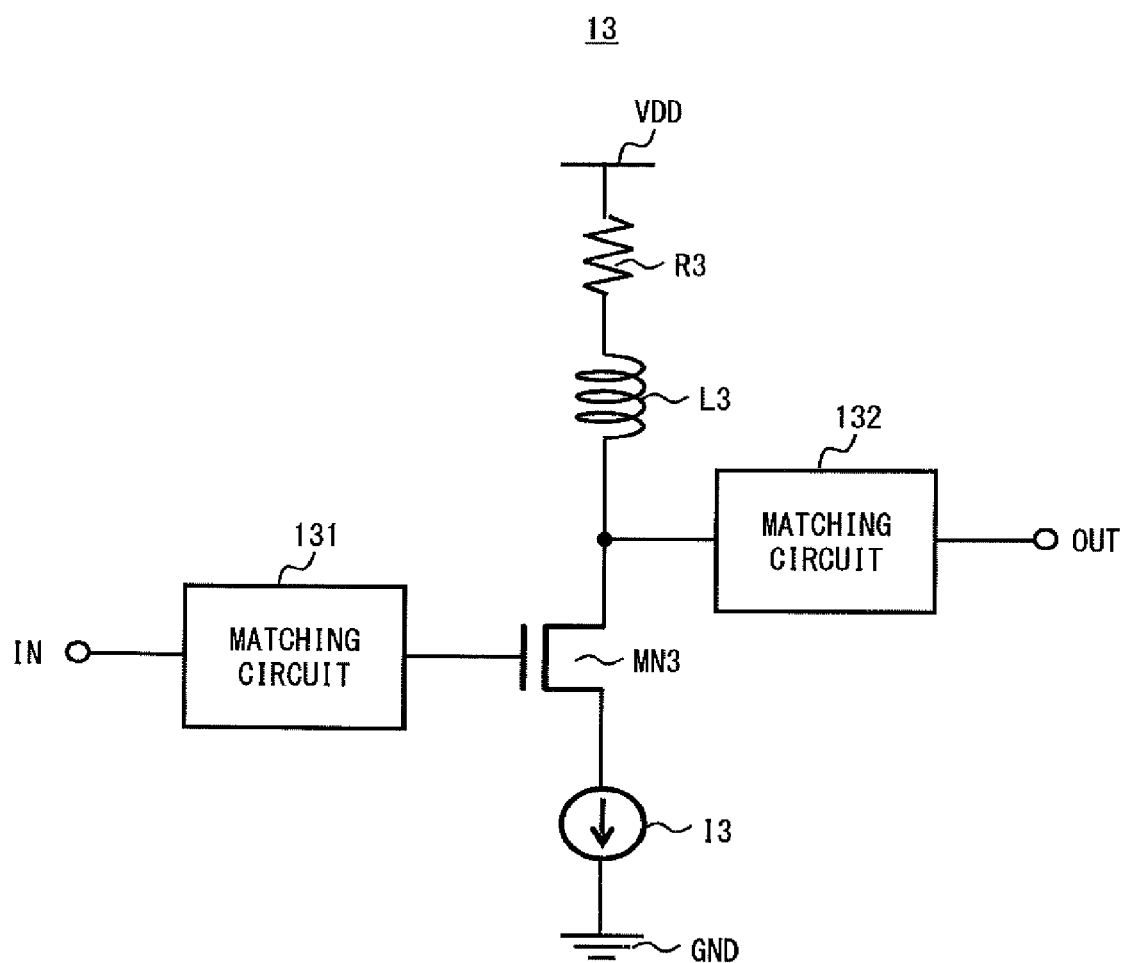
FIG. 11 is a view illustrating a configuration example of the amplifier circuit which includes matching circuits to which the inductor structure of the semiconductor device illustrated in FIG. 1 is applied.

FIG. 11 is a view illustrating a configuration example of an amplifier circuit 13 including matching circuits to which the inductor structure of the semiconductor device 1 is applied. The amplifier circuit 13 includes a resistor element R3, an inductor L3, a transistor MN3, a constant current source 13 and matching circuits 131 and 132.

The resistor element R3, the inductor L3, the transistor MN3 and the constant current source 13 are disposed in series between the power supply voltage terminal VDD and the ground voltage terminal GND. Further, in the amplifier circuit 13, an input signal IN is supplied to a gate of the transistor MN3, and the output signal OUT is outputted from a drain of the transistor MN3.

In this regard, the matching circuit 131 matches an output impedance of a circuit of a previous stage which outputs the input signal IN, and an input impedance of the matching circuit 13. Consequently, the amplifier circuit 13 can receive the input signal IN without causing loss. Further, the matching circuit 132 matches an output impedance of the amplifier circuit 13, and an input impedance of a circuit of a subsequent stage to which the output signal OUT is supplied. Consequently, the amplifier circuit 13 can transmit the output signal OUT without causing loss.

Figure 12:
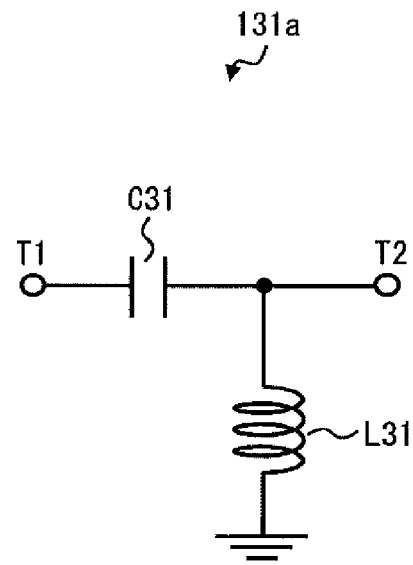
FIG. 12 is a circuit diagram illustrating a specific configuration example of the matching circuit.

FIG. 12 is a circuit diagram illustrating a specific configuration example of the matching circuit 131 as a matching circuit 131a. The matching circuit 131a includes an inductor L31 which adopts the inductor structure of the semiconductor device 1, and a capacitive element C31. The capacitive element C31 is disposed between an input terminal T1 and an output terminal T2. The inductor L31 is disposed between the output terminal T2 and the ground voltage terminal GND. The matching circuit 132 can also employ the same circuit configuration as the matching circuit 131a.

Figure 13:
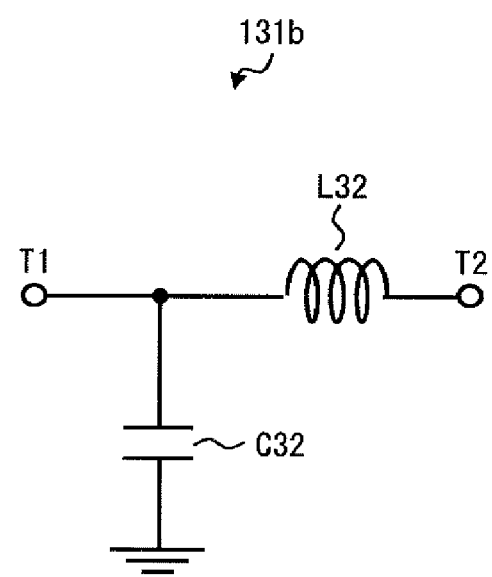
FIG. 13 is a circuit diagram illustrating another specific configuration example of the matching circuit.

FIG. 13 is a circuit diagram illustrating another specific configuration example of the matching circuit 131 as a matching circuit 131b. The matching circuit 131b includes an inductor L32 including the inductor structure of the semiconductor device 1, and a capacitive element C32. The inductor L32 is disposed between the input terminal T1 and the output terminal T2. The capacitive element C32 is disposed between the input terminal T1, and the ground voltage terminal GND. The matching circuit 132 can also employ the same circuit configuration as the matching circuit 132b.

Figure 14:
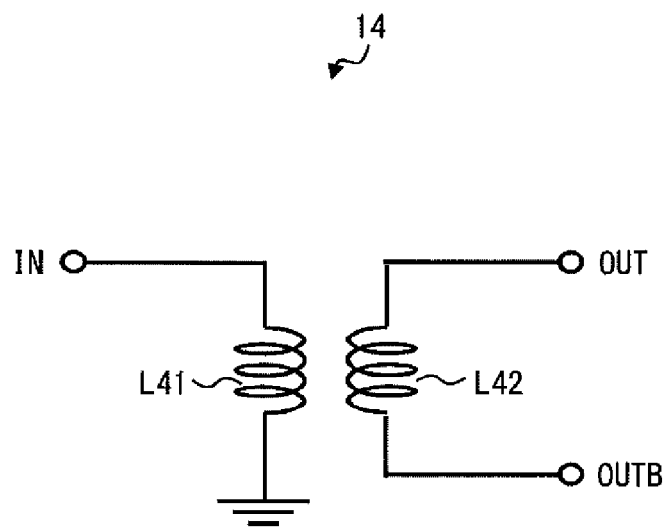
FIG. 14 is a circuit diagram illustrating a configuration example of a balun to which the inductor structure of the semiconductor device illustrated in FIG. 1 is applied.

FIG. 14 is a circuit diagram illustrating a configuration example of a balun 14 to which the inductor structure of the semiconductor device 1 is applied. The balun 14 includes inductors L41 and L42 including the inductor structures of the semiconductor device 1. The balun 14 converts the input signal IN of a single end into a magnetism by using the inductor L41, and converts the magnetism into the differential signals OUT and OUTB by using the inductor L42.

In addition to the above, circuits for which inductors are used can adopt the inductor structure of the semiconductor device 1.

Next, some modified examples of the semiconductor device 1 will be described.

Modified Example 1 of Semiconductor Device 1

Figure 16:
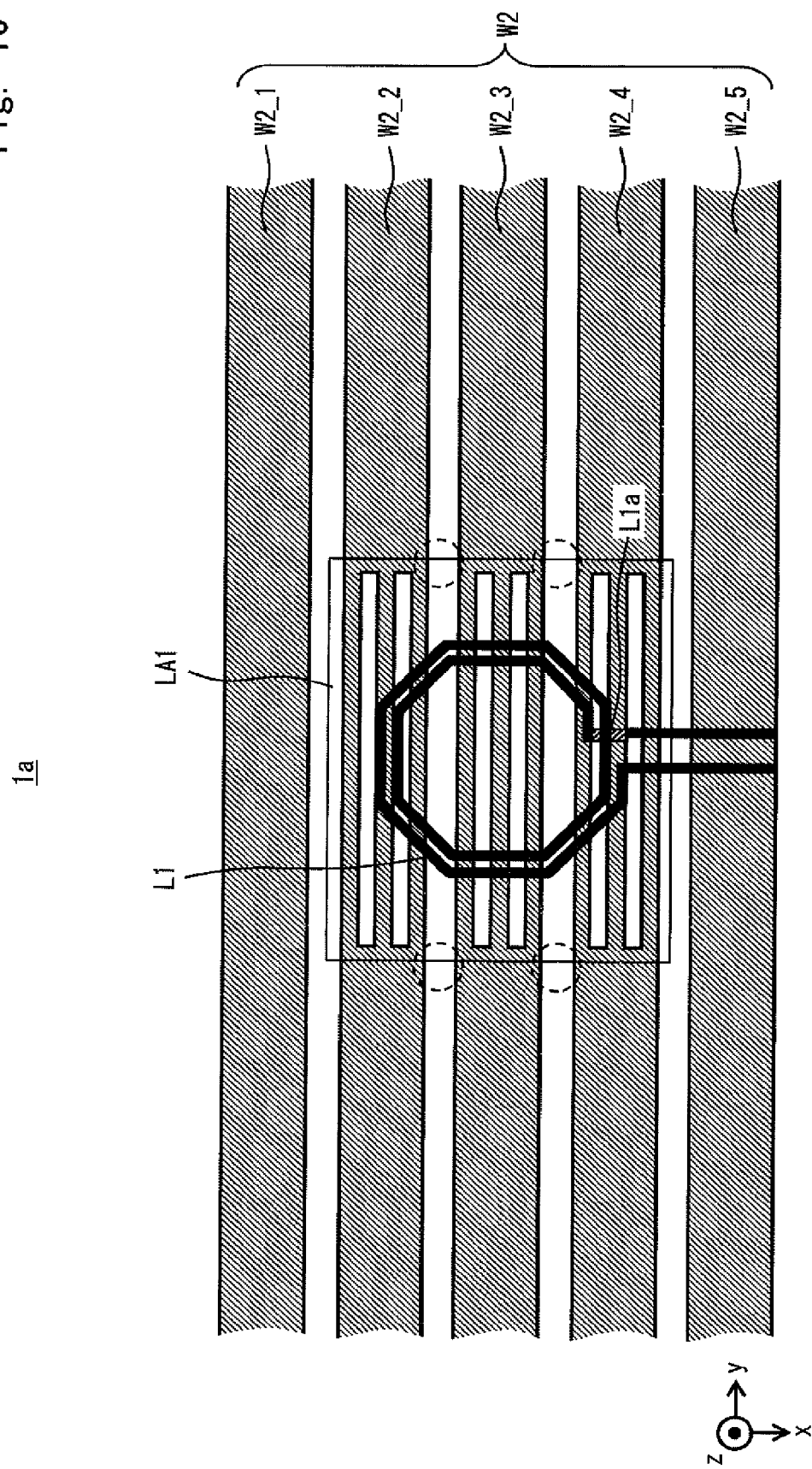
FIG. 16 is a schematic plan view illustrating modified example 1 of the semiconductor device illustrated in FIG. 1.

FIG. 16 is a schematic plan view illustrating modified example 1 of the semiconductor device 1 as a semiconductor device 1a. According to the semiconductor device 1 illustrated in FIG. 1, in the fixed potential wiring layer (second metal layer M2) located at the boundary line between the inductor formation region LA1 and the non-formation region in the plan view, a plurality of wires W2 are formed to short-circuit each other. By contrast with this, according to the semiconductor device 1a illustrated in FIG. 16, in the fixed potential wiring layer located at the boundary line between the inductor formation region LA1 and the non-formation region in the plan view, a plurality of wires W2 are formed not to short-circuit each other.

The other components of the semiconductor device 1a are the same as those in the semiconductor device 1, and therefore will not be described.

The semiconductor device 1a can also provide the substantially same effect as that of the semiconductor device 1. Further, according to the semiconductor device 1a, in the fixed potential wiring layer located at the boundary line between the inductor formation region LA1 and the non-formation region in the plan view, a plurality of wires W2 are formed not to short-circuit each other. Consequently, it is possible to propagate different fixed potentials to the neighboring wires W2. For example, it is possible to propagate the power supply voltage VDD to the wires W2_1, W2_3 and W2_5, and propagate the ground voltage GND to the wires W2_2 and W2_4.

Modified Example 2 of Semiconductor Device 1

Figure 17:
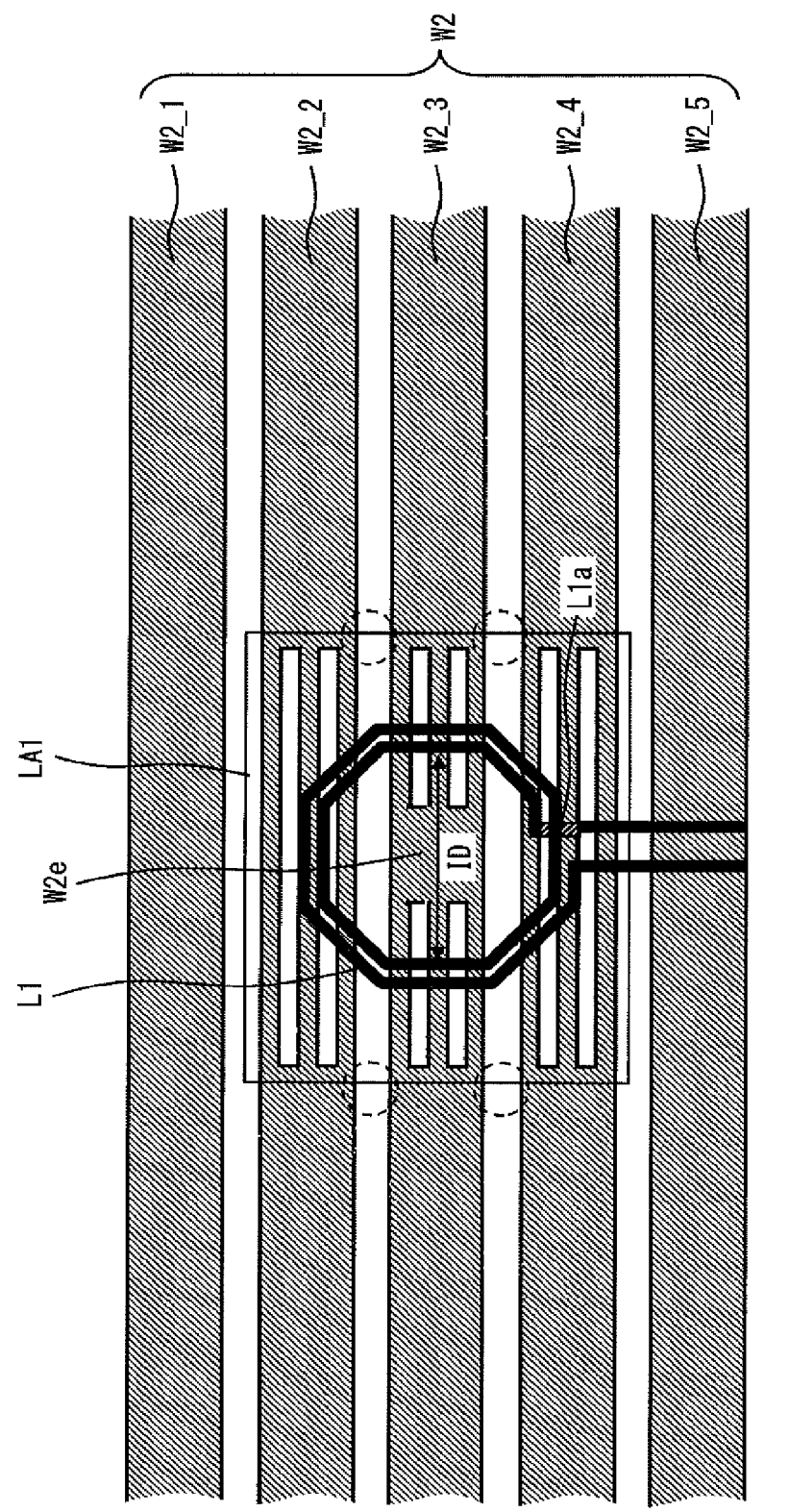
FIG. 17 is a schematic plan view illustrating modified example 2 of the semiconductor device illustrated in FIG. 1.

FIG. 17 is a schematic plan view illustrating modified example 2 of the semiconductor device 1 as a semiconductor device 1b.

As illustrated in FIG. 17, in the semiconductor device 1b, the inductor L1 having the larger inner diameter ID than a predetermined inner diameter in the plan view is formed. In this case, magnetic fluxes in a center region of the inductor L1 are small. Hence, it is not necessary to narrow the wires W2 located in the center region of the inductor L1 in the plan view. Hence, in the semiconductor device 1b, the wiring width of the wire W2 (a wire W2e in FIG. 17) located in the center region of the inductor formation region LA1 in the plan view is formed wider than the wiring widths of the wires W2 located in a rest of the inductor formation region LA1.

The other components of the semiconductor device 1b are the same as those of the semiconductor device 1a, and therefore will not be described.

The semiconductor device 1b can also provide the substantially same effect as that of the semiconductor device 1a. Further, by widening the wiring width of the wire W2e located in the center region of the inductor formation region LA1 in the plan view, the semiconductor device 1b can reduce resistance values of the wires W2 compared to a case where the wiring widths are not widened.

Modified Example 3 of Semiconductor Device 1

Figure 18:
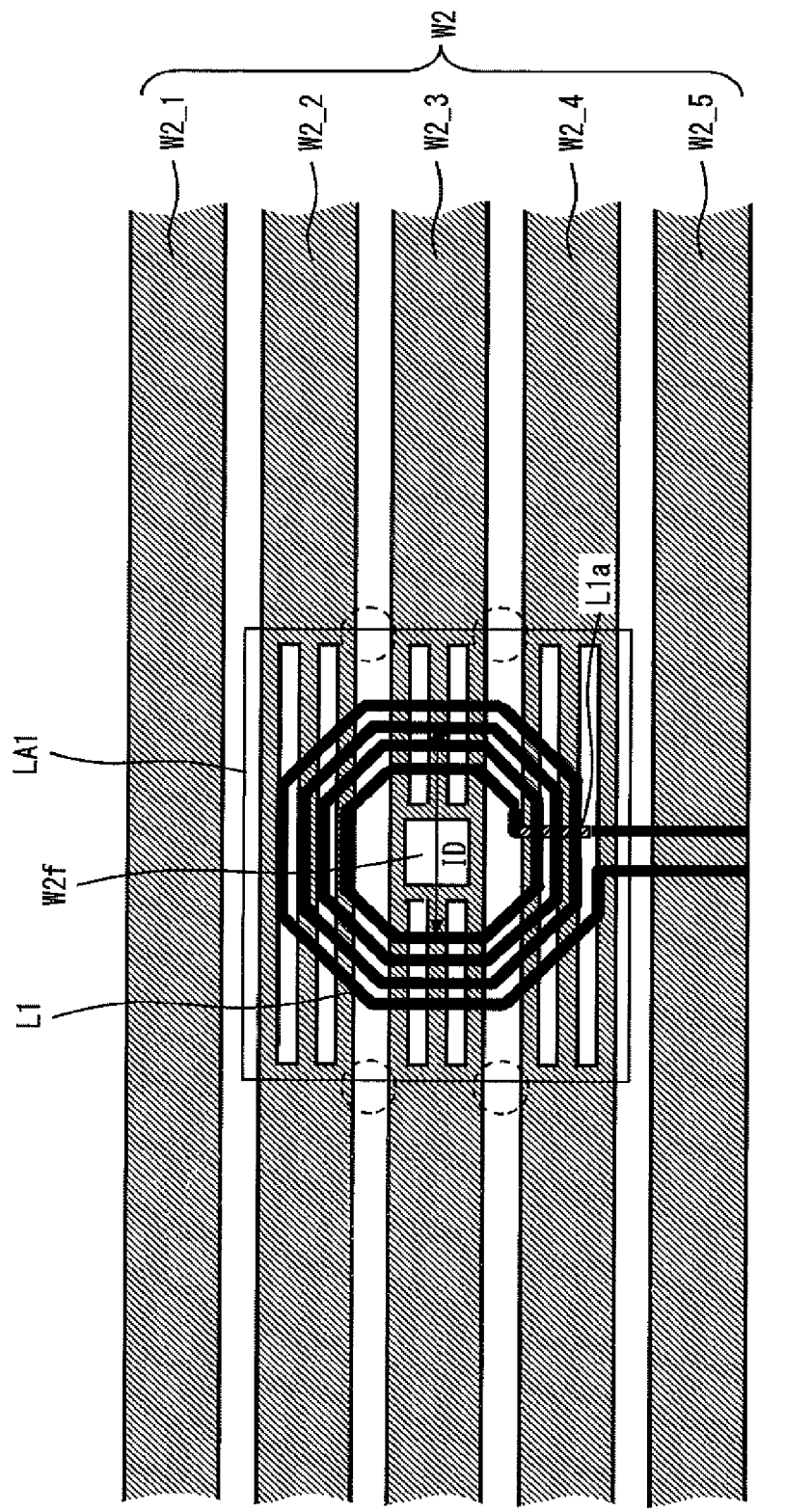
FIG. 18 is a schematic plan view illustrating modified example 3 of the semiconductor device illustrated in FIG. 1.

FIG. 18 is a schematic plan view illustrating modified example 3 of the semiconductor device 1 as a semiconductor device 1c.

As illustrated in FIG. 18, in the semiconductor device 1c, the inductor L1 having the smaller inner diameter ID than a predetermined inner diameter in a plan view is formed. In this case, magnetic fluxes in the center region of the inductor L1 are large. Hence, to avoid the magnetic fluxes, a spatial region W2f is formed instead of arranging the wires W2 in the fixed potential wiring layer located in the center region of the inductor L1 in the plan view.

The other components of the semiconductor device 1c are the same as those of the semiconductor device 1a, and therefore will not be described.

The semiconductor device 1c can also provide the substantially same effect as that of the semiconductor device 1a. Further, in the semiconductor device 1c, the spatial region W2f is formed in the fixed potential wiring layer located in the center region of the inductor formation region LA1 in the plan view. Consequently, it is possible to prevent strong magnetic fluxes produced in the center region of the inductor L1 from producing large counter-electromotive currents in the wires W2.

Modified Example 4 of Semiconductor Device 1

Figure 19:
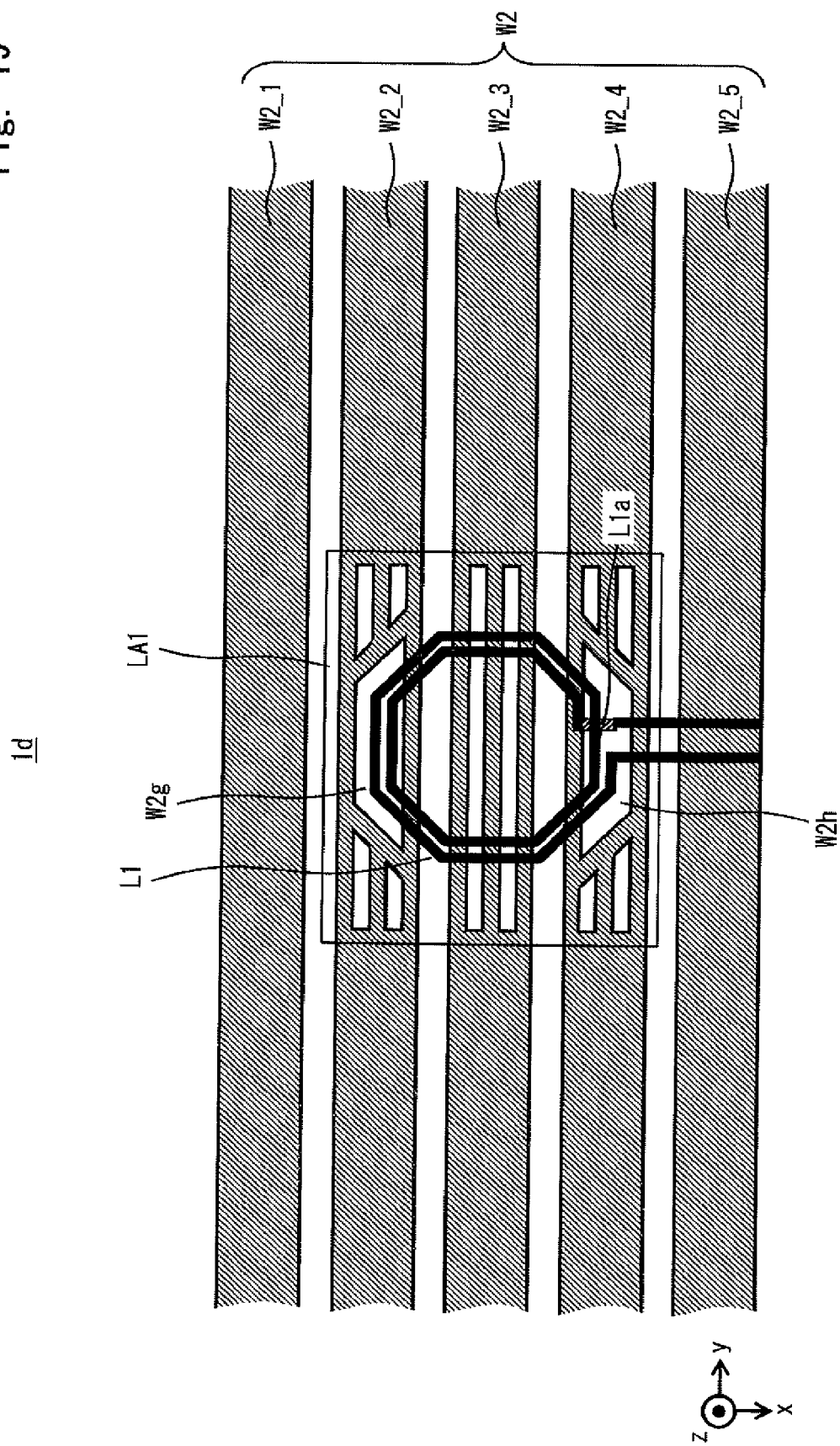
FIG. 19 is a schematic plan view illustrating modified example 4 of the semiconductor device illustrated in FIG. 1.

FIG. 19 is a schematic plan view illustrating modified example 4 of the semiconductor device 1 as a semiconductor device 1d.

When the wires W2 are disposed in the fixed potential wiring layer which overlaps the inductor L1 in the plan view, the wires W2 receive great magnetic fluxes from the inductor L1. Hence, to avoid the magnetic fluxes, a spatial region is formed instead of arranging the wires W2 in the fixed potential wiring layer which overlaps the inductor L1 in the plan view.

In the example in FIG. 19, spatial regions W2g and W2h are formed in the fixed potential wiring layer which overlaps an inductor portion extending in the same direction as an extension direction (y axis direction) of the wires W2 in the fixed potential wiring layer which overlaps the inductor L1 in the plan view.

The other components of the semiconductor device 1d are the same as those of the semiconductor device 1, and therefore will not be described.

The semiconductor device 1d can also provide the substantially same effect as that of the semiconductor device 1a. Further, in the semiconductor device 1d, the spatial regions W2g and W2h are formed in the fixed potential wiring layer which overlaps the inductor L1 in the plan view. Consequently, it is possible to prevent strong magnetic fluxes produced near the inductor L1 from producing large counter-electromotive currents in the wires W2.

Modified Example 5 of Semiconductor Device 1

Figure 20:
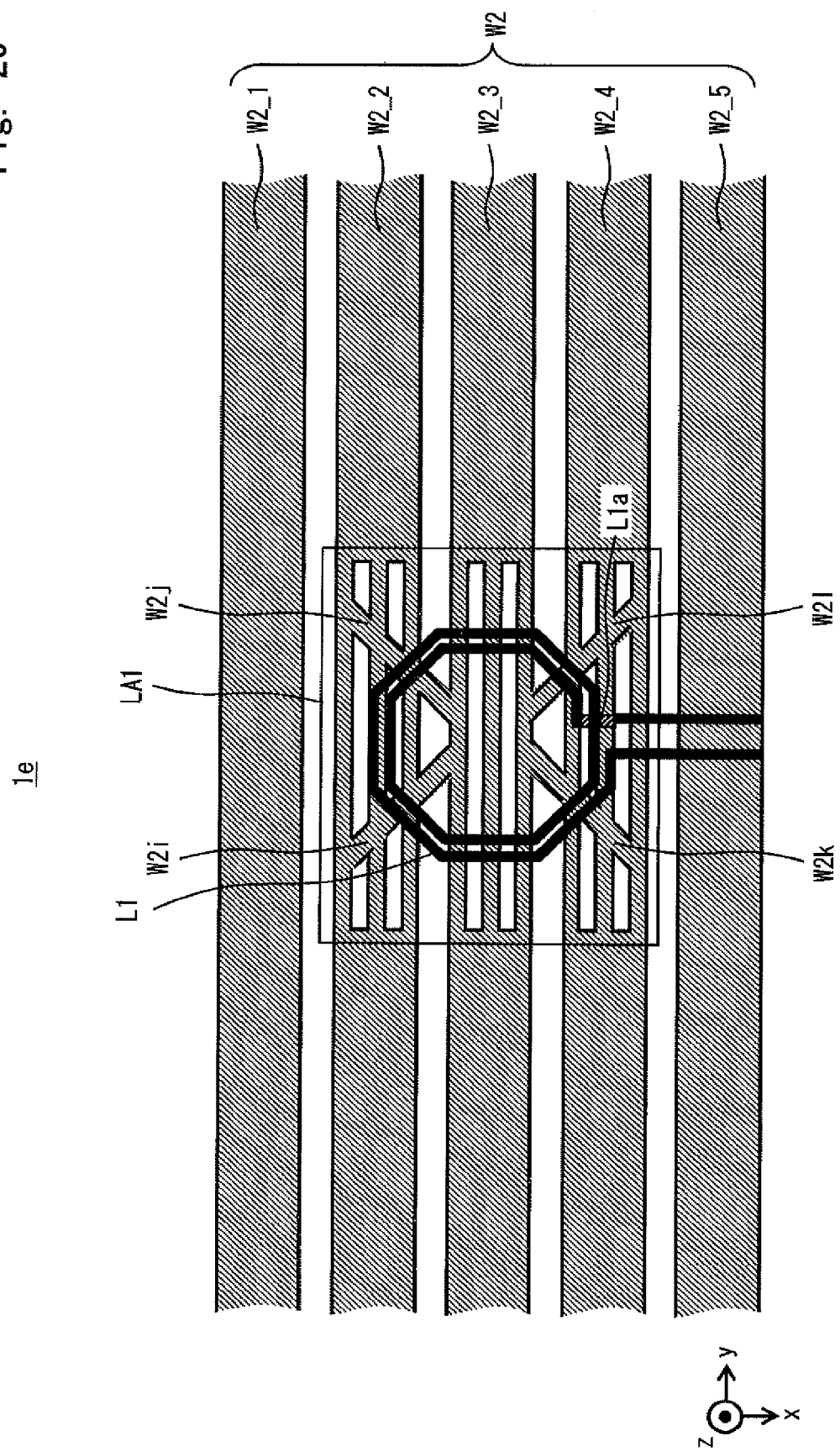
FIG. 20 is a schematic plan view illustrating modified example 5 of the semiconductor device illustrated in FIG. 1.

FIG. 20 is a schematic plan view illustrating modified example 5 of the semiconductor device 1 as a semiconductor device 1e.

As illustrated in FIG. 20, the semiconductor device 1e includes a plurality of wires W2i, W2j, W2k and W2l radially extending from the fixed potential wiring layer located in the center region of the inductor formation region LA1 in the plan view.

The other components of the semiconductor device 1e are the same as those of the semiconductor device 1a, and therefore will not be described.

The semiconductor device 1e can also provide the substantially same effect as that of the semiconductor device 1a. Further, the semiconductor device 1e includes the wires W2i, W2j, W2k and W2l radially extending from the fixed potential wiring layer located in the center region of the inductor formation region LA1 in the plan view. Consequently, it is possible to reduce resistance values of the wires W2.

Second Embodiment

Figure 21:
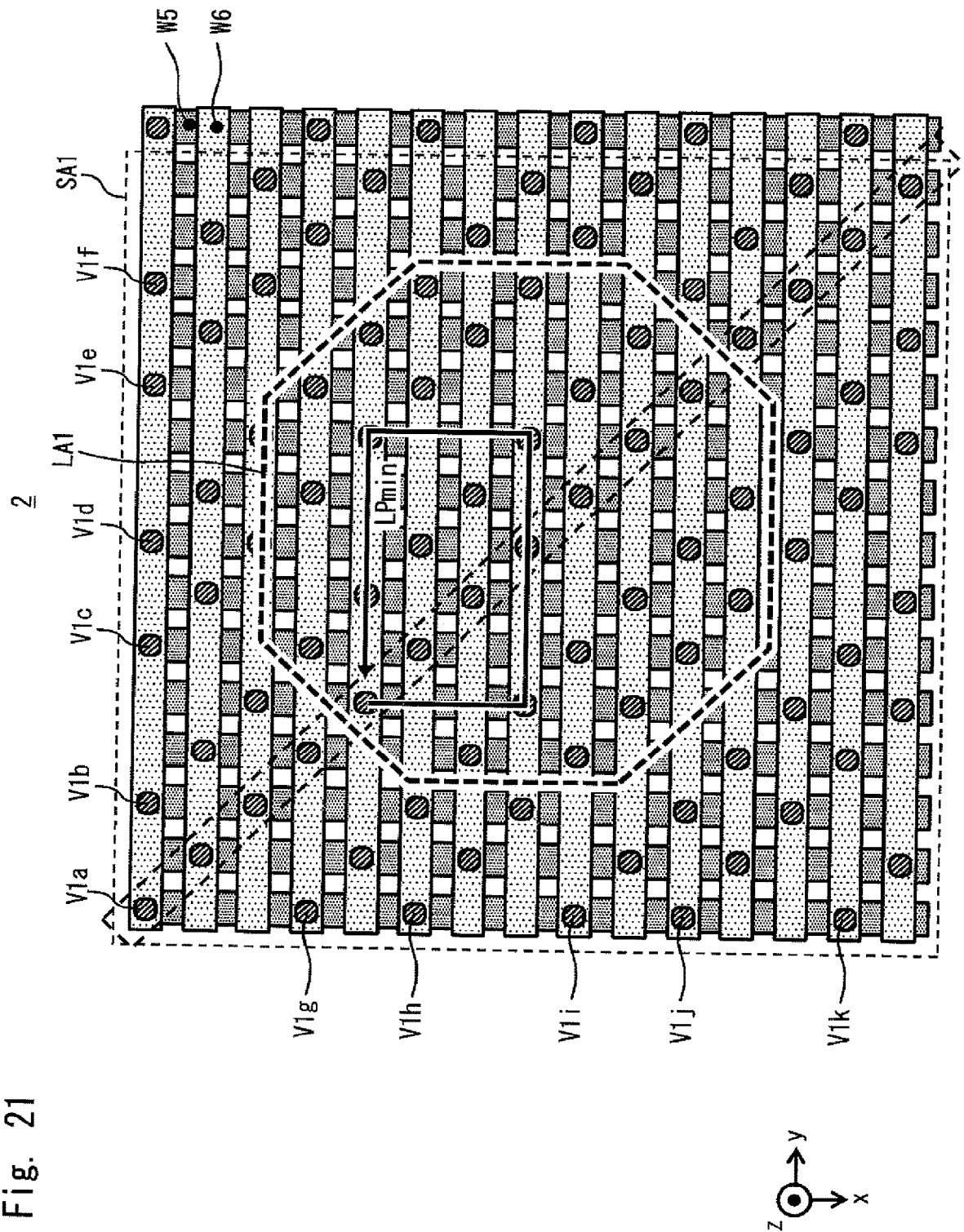
FIG. 21 is a schematic plan view illustrating a layout configuration example of a semiconductor device according to a second embodiment.

FIG. 21 is a schematic plan view illustrating a layout configuration of a semiconductor device 2 according to the second embodiment. In the present embodiment, wires are formed across two layers. More specifically, in a lower layer MD, a plurality of wires W5 to which a fixed potential (e.g. ground voltage GND) propagates are formed in slit shapes in a y axis direction extending in an x axis direction. In an upper layer MU, a plurality of wires W6 to which a fixed potential of the same level as that of a plurality of wires W5 propagates are formed in slit shapes in the x axis direction extending in the y axis direction. That is, a plurality of wires W5 formed in the lower layer MD and a plurality of wires W6 formed in the upper layer MU intersect at right angles in a plan view.

In this regard, the present embodiment describes as an example a case where fixed potentials such as the ground voltage GND propagate to the wires W5 and W6 yet is not limited to this. Signals having fluctuating potentials may propagate to the wires W5 and W6.

In this regard, if vias (or a via group which is an aggregate of small vias) V1 are disposed at all intersections of a plurality of wires W5 and a plurality of wires W6, multiple low-resistance current paths composed of the wires W5 and W6 and the vias V1 are formed. Therefore, magnetic fluxes from an inductor L1 are likely to form large eddy currents in a fixed potential wiring layer. Therefore, the magnetic fluxes produced by the large eddy currents are likely to influence the inductor L1, and deteriorate characteristics of the inductor L1.

Hence, in the present embodiment, the vias V1 are partially disposed in an inductor formation region LA1 such that a length of a minimum loop LPmin among current path loops formed by using the wires W5 and W6 and the vias V1 is longer than a predetermined length (e.g. a loop length in a case where the vias V1 are disposed at all intersections). In this regard, in the example in FIG. 21, a plurality of vias V1 are distinguished as vias V1a to V1k.

More specifically, a square region SA1 including an inductor formation region LA1 in the plan view is defined. In this regard, when the inductor formation region LA1 has a square shape, the inductor formation region LA1 may be the region SA1.

Subsequently, a plurality of vias 1a are disposed at a plurality of intersections on one diagonal line of the region SA1. Subsequently, in the same row as that of a plurality of vias 1a on this diagonal line and at a plurality of intersections of a column which is two columns next in a plus y axis direction, a plurality of vias V1b corresponding to a plurality of vias 1a are disposed. Further, in the same row as that of a plurality of vias 1b and at a plurality of intersections of a column which is three columns next in the plus y axis direction, a plurality of vias V1c corresponding to a plurality of vias 1b are disposed. Subsequently, within a range of the region SA1, disposing the vias in columns which are two columns next in the plus y direction, and disposing the vias in columns which are three columns next in the plus y direction are repeated.

Further, in the same column as that of a plurality of vias V1a and at a plurality of intersections in a row which is three rows next in a plus x axis direction, a plurality of vias V1g corresponding to a plurality of vias V1a are disposed. Furthermore, in the same column as that of a plurality of vias V1g and at a plurality of intersections in a row which is two rows next in the plus x axis direction, a plurality of vias V1h corresponding to a plurality of vias V1g are disposed. Subsequently, in the range of the region SA1, disposing the vias in rows which are three rows next in the plus x axis direction and disposing the vias in rows which are two rows next in the plus x axis direction are repeated.

Consequently, in the fixed potential wiring layer located in the inductor formation region LA1 in the plan view, the length of the minimum loop LPmin among the current path loops formed by using the wires W5, the wires W6 and the vias V1 is longer than the predetermined length (e.g., the loop length in a case where the vias V1 are disposed at all intersections). That is, in the fixed potential wiring layer located in the inductor formation region LA1 in the plan view, high-resistance current paths are formed. Therefore, eddy currents formed by the magnetic fluxes from the inductor L1 become small. As a result, the inductor L1 is hardly influenced by the magnetic fluxes produced by the eddy currents, so that it is possible to prevent characteristics deterioration.

In this regard, a disposing method of the vias V1 described in the present embodiment is an exemplary method, and may be another disposing method of the vias V1 which can increase the length of the current path loop LPmin. Further, an inductor structure of this semiconductor device 2 may be adopted by an electronic circuit such as an amplifier circuit 11.

Modified Example of Semiconductor Device 2

Figure 22:
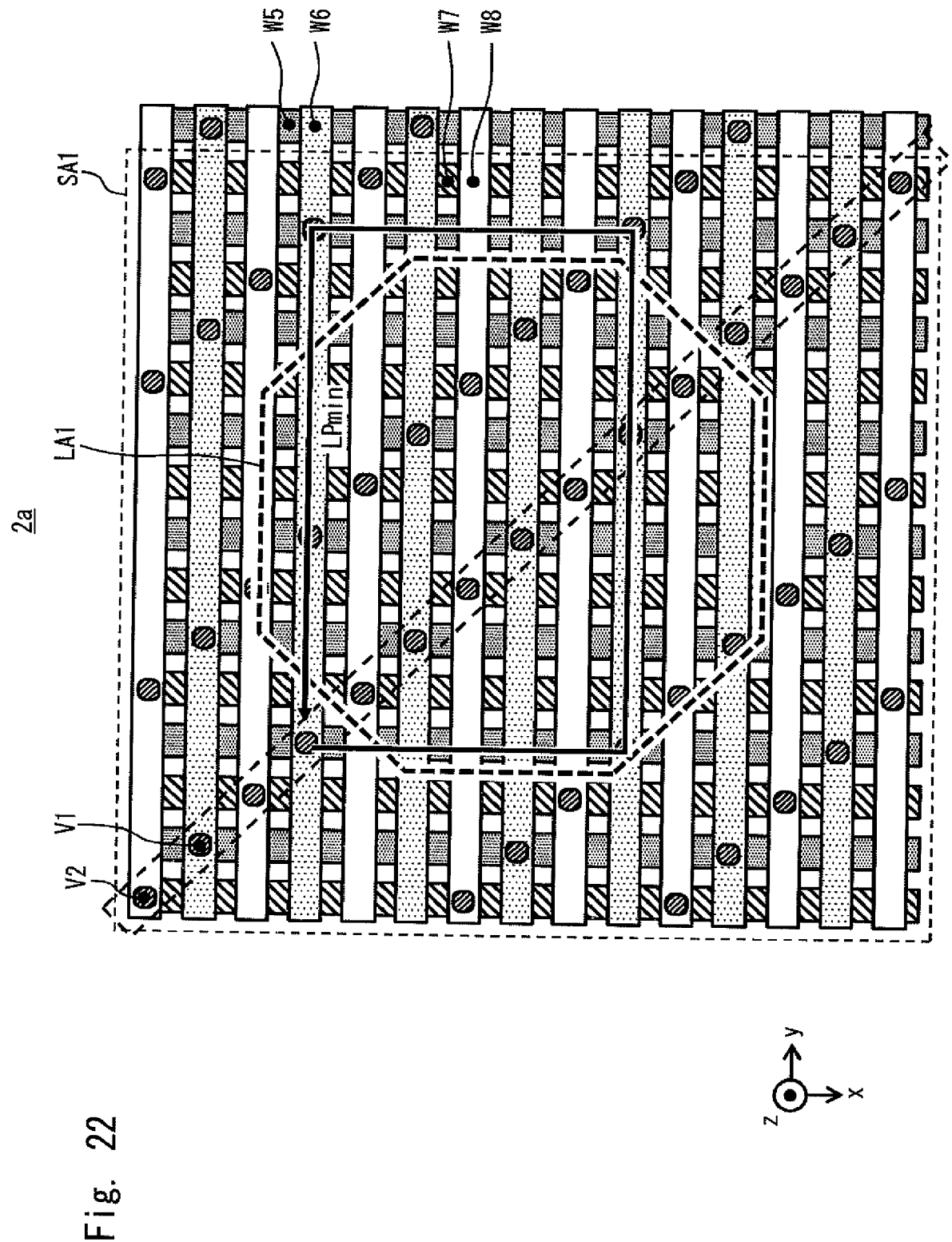
FIG. 22 is a schematic plan view illustrating a modified example of the semiconductor device illustrated in FIG. 21.

FIG. 22 is a schematic plan view illustrating the modified example of the semiconductor device 2 as a semiconductor device 2a.

In the semiconductor device 2, fixed potential wires of one type are formed across two layers. By contrast with this, in the semiconductor device 2a, fixed potential wires of two types are formed across two layers.

More specifically, in the lower layer MD, a plurality of wires W5 to which the ground voltage GND propagates and a plurality of wires W7 to which a power supply voltage VDD propagates are alternately disposed in the y axis direction extending in the x axis direction. In an upper layer MU, a plurality of wires W6 to which the ground voltage GND propagates and a plurality of wires W8 to which the power supply voltage VDD propagates are alternately disposed in the x axis direction extending in the y axis direction. That is, a plurality of wires W5 and W7 alternately disposed in the lower layer MD, and a plurality of wires W6 and W8 alternately disposed in the upper layer MU intersect at right angles in the plan view.

In addition, the present embodiment has described as an example the case where fixed potentials propagate to the wires W5 to W8, yet is not limited to this. Signals having fluctuating potential may propagate to the wires W5 to W8.

In this regard, the vias V1 are partially disposed in the inductor formation region LA1 such that a length of a minimum loop LPmin1 among current path loops formed by using the wires W5, the wires W6 and the vias V1 is longer than a predetermined length (e.g., a loop length in a case where the vias V1 are disposed at all intersections of the wires W5 and W6). Similarly, vias V2 are partially disposed in the inductor formation region LA1 such that a length of a minimum loop LPmin2 among current path loops formed by using the wires W7, the wires W8 and the vias V2 is longer than a predetermined length (e.g., a loop length in a case where the vias V2 are disposed at all intersections of the wires W7 and W8).

In this case, too, first, the square region SA1 including the inductor formation region LA1 in the plan view is defined. In this regard, when the inductor formation region LA1 has the square shape, the inductor formation region LA1 may be the region SA1.

The method for disposing the vias V1 at the intersections of a plurality of wires W5 and W6 is the same as that of the semiconductor device 2. Further, the method for disposing the vias V2 at the intersections of a plurality of wires W7 and W8 is the same as a method for disposing the vias V2 at the intersections of a plurality of wires W5 and W6.

Consequently, in the fixed potential wiring layer located in the inductor formation region LA1 in the plan view, the length of the minimum loop LPmin1 among the current path loops formed by using the wires W5, the wires W6 and the vias V1 is longer than the predetermined length (e.g., the loop length in a case where the vias V1 are disposed at all intersections). That is, in the fixed potential wiring layer located in the inductor formation region LA1 in the plan view, high-resistance current paths are formed. Hence, eddy currents formed by magnetic fluxes from the inductor L1 are small. As a result, the inductor L1 is hardly influenced by the magnetic fluxes produced by the eddy currents, so that it is possible to prevent characteristics deterioration.

Consequently, in the fixed potential wiring layer located in the inductor formation region LA1 in the plan view, the length of the minimum loop LPmin2 among the current path loops formed by using the wires W7, the wires W8 and the vias V2 is longer than the predetermined length (e.g., the loop length in a case where the vias V2 are disposed at all intersections). That is, in the fixed potential wiring layer located in the inductor formation region LA1 in the plan view, the high-resistance current paths are formed. Hence, eddy currents formed by the magnetic fluxes from the inductor L1 are small. As a result, the inductor L1 is hardly influenced by the magnetic fluxes produced by the eddy currents, so that it is possible to prevent characteristics deterioration.

In this regard, a disposing method of the vias V1 and V2 described in the present embodiment is an exemplary method, and may be another disposing method of the vias V1 and V2 which can increase the lengths of the current path loops LPmin1 and LPmin2. Further, an inductor structure of this semiconductor device 2a may be adopted by an electronic circuit such as the amplifier circuit 11.

As described above, by narrowing wiring widths of the fixed potential wires located in the range of the inductor formation region LA1 in the plan view and making the current path loops large, the semiconductor devices 1 and 2 according to the first and second embodiments reduce the eddy currents formed on the fixed potential wires by the magnetic fluxes from the inductor L1. Consequently, in the semiconductor devices 1 and 2 according to the first and second embodiments, the inductor L1 is hardly influenced by magnetic fluxes produced by the eddy currents, so that it is possible to prevent characteristics deterioration. Further, in this case, it is not necessary to arrange a shield between the fixed potential wires and the inductor L1, so that it is possible to suppress an increase in a circuit scale.

The invention invented by the inventors has been specifically described above based on the embodiments. However, the present invention is not limited to the above-described embodiments, and can be variously modified without departing from the scope of the invention.

For example, the semiconductor devices according to the above embodiments may employ a configuration where conductivity types (a p type or a n type) of a semiconductor substrate, a semiconductor layer and a diffusion layer (diffusion region) may be inverted. Consequently, when one conductivity type of the n type and the p type is a first conductivity type, and the other conductivity type of the n type and the p type is a second conductivity type, the first conductivity type may be the p type and the second conductivity type may be the n type. On the contrary, the first conductivity type may be the n type, and the second conductivity type may be the p type.

Part or all of the embodiments may be described as in the following supplementary notes yet are not limited to the below.

(Supplementary Note 1)

A method for forming a semiconductor device includes:

forming in a first layer a plurality of first wires configured to indicate fixed potentials; and forming an inductor in a second layer stacked on the first layer, and in the forming a plurality of first wires, wiring widths of the first wires located within a range of a formation region of the inductor in a plan view among the plurality of first wires are narrowed compared to wiring widths of the first wires located outside the range of the formation region of the inductor.

(Supplementary Note 2)

According to the method for forming the semiconductor device according to Supplementary Note 1, the formation region of the inductor includes a region surrounded by an outer circumferential side of the inductor in the plan view.

(Supplementary Note 3)

The method for forming the semiconductor device according to Supplementary Note 1 includes further forming a guard ring in the second layer to surround the inductor, and the formation region of the inductor is a region surrounded by a guard ring in the plan view.

(Supplementary Note 4)

The method for forming the semiconductor device according to Supplementary Note 1 further includes forming the inductor in a helical shape in the plan view, and the formation region of the inductor is determined based on an inner diameter of the inductor in the plan view.

(Supplementary Note 5)

The method for forming the semiconductor device according to Supplementary Note 1 further includes configuring the plurality of first wires to allow propagation of one of a power supply voltage and a ground voltage thereto.

(Supplementary Note 6)

The method for forming the semiconductor device according to Supplementary Note 1 further includes forming the plurality of first wires in slit shapes over the entire first layer.

(Supplementary Note 7)

The method for forming the semiconductor device according to Supplementary Note 1 further includes forming the plurality of first wires to short-circuit in the first layer located at a boundary line between the formation region and a non-formation region of the inductor in the plan view.

(Supplementary Note 8)

The method for forming the semiconductor device according to Supplementary Note 1 further includes:

forming the inductor in a helical shape in the plan view having a larger inner diameter than a predetermined inner diameter; and widening the wiring widths of the first wires located in a center region of the formation region of the inductor in the plan view among the plurality of first wires compared to the wiring widths of the first wires located in a rest of the formation region of the inductor.

(Supplementary Note 9)

The method for forming the semiconductor device according to Supplementary Note 1 further includes:

forming the inductor in a helical shape in the plan view having a smaller inner diameter than a predetermined inner diameter; and forming the plurality of first wires having a predetermined spatial region in the first layer located in a center region of the formation region of the inductor in the plan view.

(Supplementary Note 10)

The method for forming the semiconductor device according to Supplementary Note 1 includes further forming in the first layer a plurality of second wires configured to indicate fixed potentials of different levels from the plurality of first wires, and in the forming the plurality of second wires, wiring widths of the second wires located in the range of the formation region of the inductor in the plan view among the plurality of second wires are narrowed compared to wiring widths of the second wires located outside the range of the formation region of the inductor.

(Supplementary Note 11)

The method for forming the semiconductor device according to Supplementary Note 10 further includes:

configuring the plurality of first wires to allow propagation of a power supply voltage thereto; and configuring the plurality of second wires to allow propagation of a ground voltage thereto.

(Supplementary Note 12)

The method for forming the semiconductor device according to Supplementary Note 10 further includes disposing the plurality of first wires and the plurality of second wires alternately in slit shapes over the entire first layer.

(Supplementary Note 13)

The method for forming the semiconductor device according to Supplementary Note 10 further includes:

forming the inductor in a helical shape in the plan view having a larger inner diameter than a predetermined inner diameter;

widening the wiring widths of the first wires located in a center region of the formation region of the inductor in the plan view among the plurality of first wires compared to the wiring widths of the first wires located in a rest of the formation region of the inductor; and widening the wiring widths of the second wires located in the center region of the formation region of the inductor in the plan view among the plurality of second wires compared to the wiring widths of the second wires located in the rest of the formation region of the inductor.

(Supplementary Note 14)

The method for forming the semiconductor device according to Supplementary Note 10 further includes:

forming the inductor in a helical shape in the plan view having a smaller inner diameter than a predetermined inner diameter;

forming the plurality of first wires having a predetermined spatial region in the first layer located in a center region of the formation region of the inductor; and forming the plurality of second wires having a predetermined spatial region in the first layer located in the center region of the formation region of the inductor.

(Supplementary Note 15)

The method for forming the semiconductor device according to Supplementary Note 1 includes further forming a plurality of third wires configured to indicate fixed potentials, in third layer stacked on the first layer, and in the forming the plurality of third wires, wiring widths of the third wires located in the range of the formation region of the inductor in the plan view among the plurality of third wires are narrowed compared to wiring widths of the third wires located outside the range of the formation region of the inductor.

(Supplementary Note 16)

A method for forming an electronic circuit includes forming an inductor adopting a structure of the semiconductor device according to Supplementary Note 1.

(Supplementary Note 17)

A method for forming a semiconductor device includes:

forming a plurality of first wires in a first layer;

forming a plurality of second wires in a second layer stacked on the first layer to intersect the plurality of first wires;

forming a plurality of first vias at intersections of the plurality of first wires and the plurality of second wires; and forming an inductor in a third layer stacked on the first layer and the second layer, and in the forming the plurality of first vias, the plurality of first vias are disposed such that a length of the loop having the minimum length among a plurality of current path loops formed by the plurality of first wires, the plurality of second wires and the plurality of first vias in a plan view is longer than a predetermined length.

(Supplementary Note 18)

A method for forming a semiconductor device according to Supplementary Note 17 includes:

further forming a plurality of third wires in the first layer;

further forming a plurality of fourth wires in the second layer to intersect the plurality of third wires; and further forming a plurality of second vias at intersections of the plurality of third wires and the plurality of fourth wires, and in the forming the plurality of second vias, the plurality of second vias are disposed such that a length of a loop having a minimum length among a plurality of current path loops formed by the plurality of third wires, the plurality of fourth wires and the plurality of second vias in the plan view is longer than the predetermined length.

(Supplementary Note 19)

A method for forming an electronic circuit includes forming an inductor adopting a structure of the semiconductor device according to Supplementary Note 17.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a plurality of first wires formed in a first layer;
   a plurality of second wires formed to intersect the plurality of first wires in a second layer stacked on the first layer;
   a plurality of first vias formed at intersections of the plurality of first wires and the plurality of second wires; and
   an inductor formed in a third layer stacked on the first layer and the second layer,
   wherein the plurality of first vias are at least partially disposed in a region such that a length of a loop having a minimum length among a plurality of current path loops are formed by the plurality of first wires, the plurality of second wires and the plurality of first vias in a plan view is longer than a predetermined length.

2. The semiconductor device according to claim 1, further comprising:
   a plurality of third wires formed in the first layer;
   a plurality of fourth wires formed to intersect the plurality of third wires in the second layer; and
   a plurality of second vias formed at intersections of the plurality of third wires and the plurality of fourth wires,
   wherein the plurality of second vias are disposed such that a length of a loop having a minimum length among a plurality of current path loops formed by the plurality of third wires, the plurality of fourth wires and the plurality of second vias in the plan view is longer than the predetermined length.

3. An electronic circuit comprising an inductor adopting a structure of the semiconductor device according to claim 1, wherein the plurality of first vias are partially disposed in the region comprising an inductor formation region of the inductor such that the length of a loop having the minimum length among the plurality of current path loops formed by the plurality of first wires, the plurality of second wires and the plurality of first vias in a plan view is longer than the predetermined length.

4. The semiconductor device according to claim 1, wherein the plurality of first wires are configured to allow propagation of one of a power supply voltage and a ground voltage thereto,
   wherein the plurality of first vias are partially disposed in the region comprising an inductor formation region such that the length of a loop having the minimum length among the plurality of current path loops formed by the plurality of first wires, the plurality of second wires and the plurality of first vias in a plan view is longer than the predetermined length.

5. The semiconductor device according to claim 1, wherein the plurality of first wires are formed in slit shapes over the entire first layer, and
   wherein the predetermined length comprises a loop length where the first vias are disposed at intersections of the plurality of wires.

6. The semiconductor device according to claim 1, further comprising a plurality of second wires formed in the first layer and configured to indicate a fixed potential of a level different from that of the plurality of first wires.

7. The semiconductor device according to claim 1, wherein
   the plurality of first wires are configured to allow propagation of a power supply voltage thereto, and
   the plurality of second wires are configured to allow propagation of a ground voltage thereto.

8. The semiconductor device according to claim 1, wherein in first layer, the plurality of first wires to which a fixed potential propagates are formed in slit shapes in a y axis direction extending in an x axis direction.

9. The semiconductor device according to claim 1, wherein in the second layer, the plurality of second wires to which a fixed potential of the same level as that of the plurality of first wires propagates are formed in slit shapes in the x axis direction extending in the y axis direction.

10. The semiconductor device according to claim 1, wherein the plurality of first wires formed in the first layer and the plurality of second wires formed in the second layer intersect at right angles in a plan view.

11. The semiconductor device according to claim 1, wherein the plurality of first vias are partially formed in an inductor formation region at intersections of the plurality of first wires and the plurality of second wires.

12. The semiconductor device according to claim 1, wherein in a fixed potential wiring layer of the first and second layer located in an inductor formation region, the plurality of second wires and the plurality of first vias is longer than the predetermined length of the loop where the plurality of vias are disposed at the intersections.

13. A semiconductor device, comprising:
   a plurality of first wires formed in a first layer;
   a plurality of second wires formed to intersect the plurality of first wires in a second layer;
   a plurality of first vias formed at intersections of the plurality of first wires and the plurality of second wires; and
   an inductor formed in a third layer stacked on the first layer and the second layer, wherein the plurality of first vias are at least partially disposed in a region such that a length of a loop having a minimum length among a plurality of current path loops are formed by the plurality of first wires, the plurality of second wires and the plurality of first vias in a plan view is longer than a predetermined length.

14. An electronic circuit comprising an inductor adopting a structure of the semiconductor device according to claim 13,
wherein the plurality of first vias are partially disposed in the region comprising an inductor formation region of the inductor such that the length of a loop having the minimum length among the plurality of current path loops formed by the plurality of first wires, the plurality of second wires and the plurality of first vias in a plan view is longer than the predetermined length.

15. The semiconductor device according to claim 13, wherein the plurality of first wires are configured to allow propagation of one of a power supply voltage and a ground voltage thereto,
wherein the plurality of first vias are partially disposed in the region comprising an inductor formation region such that the length of a loop having the minimum length among the plurality of current path loops formed by the plurality of first wires, the plurality of second wires and the plurality of first vias in a plan view is longer than the predetermined length.

16. The semiconductor device according to claim 13, wherein the plurality of first wires are formed in slit shapes over the entire first layer, and
wherein the predetermined length comprises a loop length where the first vias are disposed at intersections of the plurality of wires.

17. The semiconductor device according to claim 13, wherein the plurality of first vias are partially formed in an inductor formation region at intersections of the plurality of first wires and the plurality of second wires.

18. The semiconductor device according to claim 13, wherein in a fixed potential wiring layer of the first and second layer located in an inductor formation region, the plurality of second wires and the plurality of first vias is longer than the predetermined length of the loop where the plurality of vias are disposed at the intersections.

19. The semiconductor device according to claim 13, wherein
the plurality of first wires are configured to allow propagation of a power supply voltage thereto, and
the plurality of second wires are configured to allow propagation of a ground voltage thereto.

20. A semiconductor device comprising:
a plurality of first wires formed in a first layer;
a plurality of second wires formed to intersect the plurality of first wires in a second layer stacked on the first layer;
a plurality of first vias formed at intersections of the plurality of first wires and the plurality of second wires; and
an inductor formed in a third layer stacked on the first layer and the second layer,
wherein the plurality of first vias are disposed at an inductor formation region such that a length of a loop having a minimum length among a plurality of current path loops formed by the plurality of first wires, the plurality of second wires and the plurality of first vias in a plan view is longer than a predetermined length.

* * * * *